US009385281B2

(12) United States Patent
Kwon et al.

(10) Patent No.: US 9,385,281 B2
(45) Date of Patent: *Jul. 5, 2016

(54) GRAPHENE SHEET, TRANSPARENT ELECTRODE, ACTIVE LAYER INCLUDING THE SAME, DISPLAY, ELECTRONIC DEVICE, OPTOELECTRONIC DEVICE, BATTERY, SOLAR CELL, AND DYE-SENSITIZED SOLAR CELL INCLUDING THE ELECTRODE OR ACTIVE LAYER

(71) Applicant: UNIST (ULSAN NATIONAL INSTITUTE OF SCIENCE AND TECHNOLOGY), Ulsan (KR)

(72) Inventors: Soon-Yong Kwon, Ulsan (KR); Sung Youb Kim, Ulsan (KR); Ki bog Park, Ulsan (KR); Jin Sung Kwak, Busan (KR); Jae Hwan Chu, Jeonju-si (KR); Jae Kyung Choi, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 109 days.

This patent is subject to a terminal disclaimer.

(21) Appl. No.: 14/159,521

(22) Filed: Jan. 21, 2014

(65) Prior Publication Data

US 2014/0131761 A1    May 15, 2014

Related U.S. Application Data

(63) Continuation of application No. PCT/KR2011/005438, filed on Jul. 22, 2011.

(51) Int. Cl.
*H01L 33/42* (2010.01)
*H01B 1/04* (2006.01)
*H01M 4/38* (2006.01)
*H01M 4/96* (2006.01)
(Continued)

(52) U.S. Cl.
CPC ............. *H01L 33/42* (2013.01); *B82Y 30/00* (2013.01); *B82Y 40/00* (2013.01); *C01B 31/0446* (2013.01);
(Continued)

(58) Field of Classification Search
CPC .... C23C 16/26; C23C 16/44; C01B 31/0446; Y10T 428/31551
USPC ........ 438/455, 473, 478, 507, 509; 257/9, 20, 257/24, 29, 39, 76, 77, 288
See application file for complete search history.

(56) References Cited

U.S. PATENT DOCUMENTS

2009/0267060 A1* 10/2009 Forrest et al. .................... 257/40
2011/0123776 A1*  5/2011 Shin et al. ....................... 428/172
2011/0171427 A1    7/2011 Kim

FOREIGN PATENT DOCUMENTS

| EP | 2281779 | 2/2011 |
| EP | 2327662 | 6/2011 |
| EP | 2544996 | 1/2013 |
| KR | 2009-0026568 | 3/2009 |
| KR | 2009-0028007 | 3/2009 |

(Continued)

OTHER PUBLICATIONS

The extended European Search Report, European Patent Office, Mar. 9, 2015, European Patent Application No. 11870060.8.

(Continued)

*Primary Examiner* — Mohammad Islam
*Assistant Examiner* — Ratisha Mehta
(74) *Attorney, Agent, or Firm* — Lex IP Meister, PLLC

(57) ABSTRACT

The present invention relates to a graphene sheet and a transparent electrode, and an active layer including the same, and a display device, an electronic device, an optoelectronic device, a battery, a solar cell, and a dye-sensitized solar cell including these. The graphene sheet includes a lower sheet including 1 to 20 graphene layers, and a ridge formed on the lower sheet and including more graphene layers. The ridge has a metal grain boundary shape.

19 Claims, 20 Drawing Sheets

(51) Int. Cl.
  *C01B 31/04* (2006.01)
  *H01L 31/0224* (2006.01)
  *B82Y 30/00* (2011.01)
  *B82Y 40/00* (2011.01)

(52) U.S. Cl.
  CPC .......... *H01B 1/04* (2013.01); *H01L 31/022466* (2013.01); *H01M 4/38* (2013.01); *H01M 4/96* (2013.01); *C01B 2204/04* (2013.01); *C01B 2204/20* (2013.01); *C01B 2204/22* (2013.01); *C01B 2204/32* (2013.01); *Y02E 10/542* (2013.01); *Y02E 60/50* (2013.01); *Y10T 428/30* (2015.01)

(56) References Cited

FOREIGN PATENT DOCUMENTS

KR  2009-0043418  5/2009
KR  2009-0065206  6/2009

OTHER PUBLICATIONS

International Search Authority, International Search Report dated Mar. 27, 2012 of the PCT application No. PCT/KR2011/005438.
Alfonso Reina et al., "Large Area, Few-Layer Graphene Films on Arbitrary Substrates by Chemical Vapor Deposition", Nano Letters, vol. 9, Dec. 1, 2008(Web Publication Date), No. 1, p. 30-35.

* cited by examiner (a)

1503

(b)

1501
1502
1503  1503  1503

GRAPHENE SHEET, TRANSPARENT ELECTRODE, ACTIVE LAYER INCLUDING THE SAME, DISPLAY, ELECTRONIC DEVICE, OPTOELECTRONIC DEVICE, BATTERY, SOLAR CELL, AND DYE-SENSITIZED SOLAR CELL INCLUDING THE ELECTRODE OR ACTIVE LAYER

CROSS-REFERENCE TO RELATED APPLICATION

This application claims priority to and the benefit of Korean Patent Application No. 10-2011-0073117 filed in the Korean Intellectual Property Office on Jul. 22, 2011, the entire contents of which are incorporated herein by reference.

BACKGROUND OF THE INVENTION (a) Field of the Invention

The present invention relates to a graphene sheet, a transparent electrode and an active layer including the same, a display device, and an electronic device, and an optoelectronic device, a battery, a solar cell, and a dye-sensitized solar cell including the same.

(b) Description of the Related Art

In general, various devices such as a display, a light emitting diode, a solar cell, and the like transmit light to display an image or to produce electric power, and thus necessarily require a transparent electrode transmitting light. The transparent electrode may most widely include indium tin oxide (ITO).

However, as more indium is consumed, the cost of indium tin oxide increases as it becomes scarcer. Further, as a transparent electrode using indium is known to have chemical and electrical characteristic defects, development of an alternative electrode material that can replace the indium is being actively undertaken.

On the other hand, silicon is used for an active layer for an electronic device and a semiconductor device. As an example, a thin film transistor is illustrated here.

In general, a thin film transistor has multi-layers, and in particular, includes a semiconductor layer, an insulation layer, a protection layer, an electrode layer, and the like. Each layer included in the thin film transistor is formed in a sputtering method or a chemical vapor deposition (CVD) method, and is then appropriately patterned through lithography. A thin film transistor is widely used at present, and includes an amorphous silicon layer as a semiconductor layer. The amorphous silicon layer works as a conductive channel in which electrons flow. However, a thin film transistor has a limit in a display due to low electron mobility.

Silicon has carrier mobility of about 1000 $cm^2$/Vs at room temperature.

In order to solve this problem, Japan Patent Laid-Open Publication No. Pyeung No. 11-340473 discloses a thin film transistor prepared by sequentially coating a protection layer and an amorphous silicon layer on a substrate and crystallizing the coated product with a laser to change a polysilicon layer into an active layer. In this method, the protection layer and the amorphous silicon layer are coated in a radio frequency (RF) sputtering method. However, since the RF sputtering method has a problem of uneven thickness as well as a very slow coating speed, and thus forms a layer that is sensitive to laser energy density change, it may form a polysilicon layer with unstable electrical characteristics when the polysilicon layer is crystallized with a laser.

On the other hand, a chemical vapor deposition (CVD) method as opposed to the sputtering method may be used to form a protection layer and a polysilicon active layer. However, this method requires a process temperature of 500° C., and accordingly, a glass substrate may be annealed at the high temperature. In addition, the chemical vapor deposition (CVD) method additionally requires an annealing process to remove hydrogen diffused inside a thin film and causing a critical problem, and accordingly may not form a polysilicon layer with uniform electrical characteristics.

Therefore, a new material needs to be developed to fabricate a faster and better device.

SUMMARY OF THE INVENTION

An exemplary embodiment of the present invention provides a graphene sheet with a large area and/or excellent electrical and optical properties. The graphene sheet may have no wrinkles.

Another embodiment of the present invention provides a transparent electrode including the graphene sheet and having improved optical properties.

A further embodiment of the present invention provides an active layer for an organic/inorganic electronic device including the graphene sheet and having improved physical, electrical, and optical properties.

A further embodiment of the present invention provides a display, an organic/inorganic optoelectronic/electronic device, a battery, and a solar cell or a dye-sensitized solar cell including the transparent electrode and the active layer.

According to one embodiment of the present invention, a graphene sheet includes 1 to 20 graphene layers, of which the lowest graphene layer contacting a substrate is continually formed without wrinkles.

All the graphene layers included in the graphene sheet are continually formed without wrinkles.

The graphene sheet has an area of equal to or more than 1 $\mu m^2$.

The graphene sheet may be formed on the substrate.

The graphene sheet includes a graphene lower sheet formed of 1 to 20 layers, and a ridge formed of more layers than the lower sheet on the lower sheet. The ridge has a metal grain boundary shape.

The ridge may include 3 to 50 graphene layers.

The metal may have a grain size ranging from 10 nm to 10 mm.

The metal grain may be in a size range of 10 nm to 500 µm.

The metal grain may be in a size range of 50 nm to 10 µm.

The graphene sheet may have transparency of equal to or more than 60%.

The graphene sheet may have transparency of equal to or more than 80%.

The graphene sheet may have sheet resistance of equal to or less than 2000 Ω/square.

The graphene sheet may have sheet resistance of equal to or less than 274 Ω/square.

According to another embodiment of the present invention, a transparent electrode including the graphene sheet is provided.

According to another embodiment of the present invention, an active layer including the graphene sheet is provided.

According to another embodiment of the present invention, a display device including the transparent electrode is provided.

According to another embodiment of the present invention, an electronic device including the active layer is provided.

The display device may be a liquid crystal display, an electronic paper display device, or an optoelectronic device.

The electronic device may be a transistor, a sensor, or an organic/inorganic semiconductor device.

According to another embodiment of the present invention, an optoelectronic device including an anode, a hole transport layer (HTL), an emission layer, an electron transport layer (ETL), and a cathode is provided.

The anode is the transparent electrode.

The optoelectronic device may further include an electron injection layer (EIL) and a hole injection layer (HIL).

According to another embodiment of the present invention, a battery including the transparent electrode is provided.

According to another embodiment of the present invention, a solar cell including the transparent electrode is provided.

According to another embodiment of the present invention, a solar cell that includes lower and upper electrode layers laminated on a substrate and at least one active layer between the lower and upper electrode layers is provided. The active layer is the aforementioned active layer.

According to another embodiment of the present invention, a dye-sensitized solar cell is provided that includes a semiconductor electrode, an electrolyte layer, and an opposed electrode. The semiconductor electrode includes a transparent electrode and a photoabsorption layer. The photoabsorption layer includes a nanoparticle oxide and a dye. The transparent electrode and the opposed electrode may be the aforementioned transparent electrode.

Yet another embodiment of the present invention may provide a graphene sheet with a large area on a subject substrate without a transferring process.

Furthermore, one embodiment of the present invention provides a graphene sheet with excellent electrical and optical properties.

The graphene sheet may be used to fabricate a display device, an optoelectronic/electronic device, a battery, and a solar cell with excellent chemical, electrical, and optical properties, and a transistor, a sensor, and an organic/inorganic semiconductor device with excellent physical, electrical, and optical properties.

DETAILED DESCRIPTION

Figure 1:
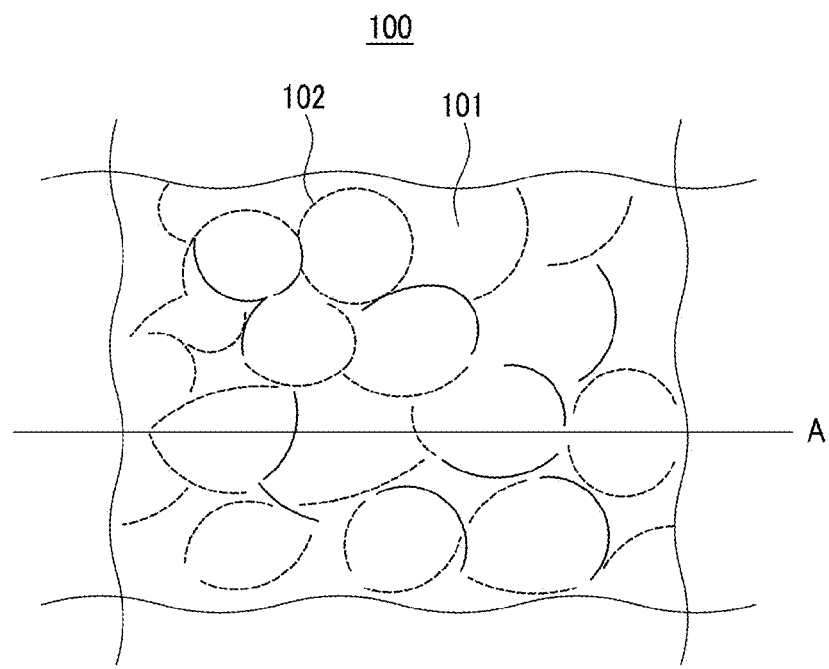
FIG. 1 is a top plan view showing a graphene sheet according to one embodiment of the present invention.

Exemplary embodiments of the present disclosure will hereinafter be described in detail. However, these embodiments are only exemplary, and the present invention is not limited thereto.

In this specification, a term "graphene sheet" indicates that graphene having a polycyclic aromatic molecule formed by a plurality of carbon atoms connected through a covalent bond is formed into a single layer or multi-layer. The carbon atoms connected through the covalent bond form a six-membered ring as a basic repeating unit, but may further include a five-membered ring and/or a seven-membered ring.

The graphene may have various structures depending on the amount of five-membered and/or seven-membered cycles therein.

The graphene sheet may be formed of the aforementioned single graphene layer, or with multiple graphene layers prepared by accumulating several graphene layers (in general, less than ten layers) at a thickness of up to 100 nm. In general, the graphene is saturated with hydrogen atoms.

In general, graphene has a main characteristic that electrons move as if they had no mass and flow at the speed of light in a vacuum. The graphene is known to have high electron mobility ranging from about 10,000 to 100,000 $cm^2/Vs$.

The multi-graphene layers have surface contact with one another, and thus have very low contact resistance compared with carbon nanotubes having point contact.

In addition, a graphene sheet may be very thin and thus no has problem due to surface roughness.

In particular, since a graphene sheet with a predetermined thickness may have various electrical characteristics depending on its crystal direction, and thus realizes electrical characteristics in a desired direction, it may be usefully applied to a device.

Hereinafter, a graphene sheet according to one embodiment of the present invention is illustrated referring to the drawings.

According to one embodiment of the present invention, a graphene sheet may be formed of 1 to 20 graphene layers on a substrate, and the lower graphene layer contacting the substrate in the graphene sheet may be continually formed without a wrinkle.

As aforementioned, graphene is a carbon combine and is formed into a layer. However, the graphene is impossible to grow without a wrinkle on a substrate (e.g., a substrate for an electronic device) by even the most recent technology.

Conventionally, graphene with a large area is formed by chemically depositing a carbon material on a metal like nickel (Ni) (e.g., by chemical vapor deposition (CVD)).

The chemical deposition may be performed at a high temperature (about 1000° C.). Then, when the graphene is cooled to room temperature, a wrinkle may be formed on the graphene due to its thermal expansion coefficient differing from the nickel.

In addition, the graphene is necessarily transferred to a substrate (e.g., a $SiO_2$ substrate), during which the graphene may be wrinkled.

The substrate may be, for example, a Group IV semiconductor substrate such as Si, Ge, SiGe, and the like; a Group III-V compound semiconductor substrate such as GaN, AlN, GaAs, AlAs, GaP, and the like; a Group II-VI compound semiconductor substrate such as ZnS, ZnSe, and the like; an oxide semiconductor substrate such as ZnO, MgO, sapphire, and the like; other insulator substrates such as glass, quartz, $SiO_2$, and the like; or an organic material substrate such as a polymer, a liquid crystal, and the like.

Figure 15:
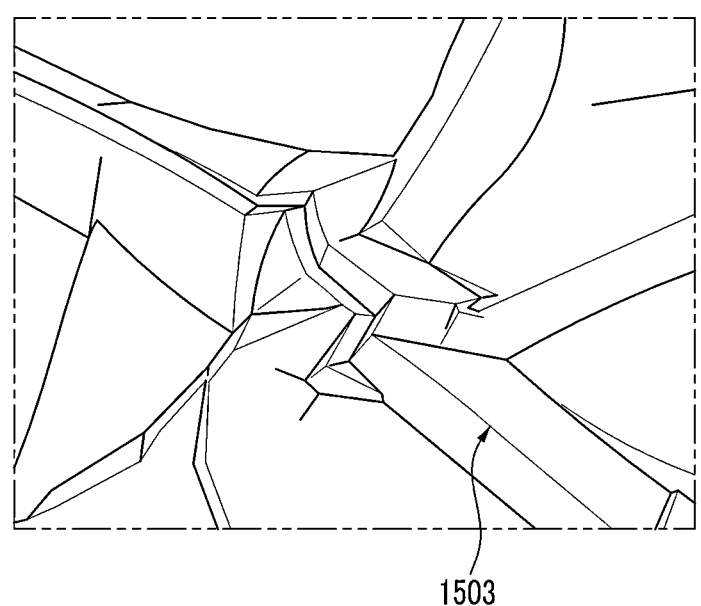
FIG. 15 is the cross-sectional view of a conventional graphene sheet.
Figure 15:
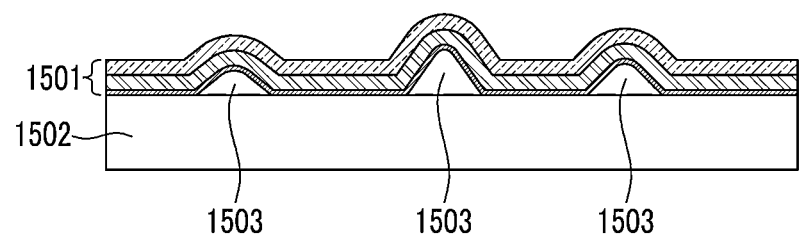

FIG. 15 is a schematic diagram showing graphene formed in a conventional chemical deposition method that is transferred onto a substrate. In FIG. 15 (a) is the top plan view of the graphene, while (b) is a cross-sectional view thereof.

Referring to FIG. 15, since a graphene sheet 1501 has a wrinkle 1503, the graphene sheet 1501 may have a deviation from a substrate 1502.

The deviation due to the wrinkle 1503 may deteriorate characteristics of the graphene sheet 1501.

According to one embodiment of the present invention, all the graphene layers in the graphene sheet are continually formed without a wrinkle.

In addition, the graphene sheet may have an area of more than 1 μm². In particular, the graphene sheet may have an area of more than 10 μm², more than 100 μm², or several mm².

The graphene sheet may have an aspect ratio ranging from 1:1000 to 1000:1, 1:100 to 100:1, or 1:10 to 10:1. However, the aspect ratio may be adjusted depending on a required substrate, and has no particular limit.

In addition, the graphene sheet may be directly formed on the substrate. In other words, a graphene sheet may be directly formed on a substrate without a transferring process, unlike a conventional method.

Since the transferring process is omitted, the graphene sheet may be prevented from being wrinkled.

Figure 2:
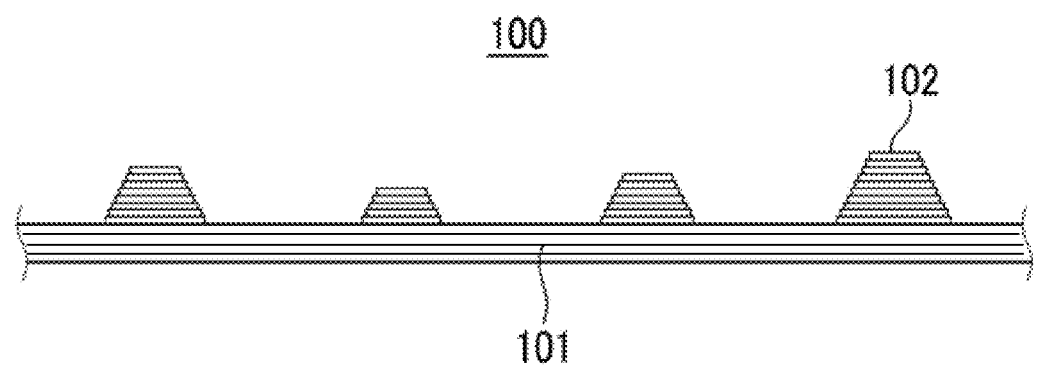
FIG. 2 shows the cross-sectional view of the graphene sheet according to one embodiment of the present invention.

FIG. 1 provides the top plan view of a graphene sheet 100 according to one embodiment of the present invention, and FIG. 2 provides the cross-sectional view of the graphene sheet 100. FIG. 2 provides the cross-sectional view of the graphene sheet referring to A marked in FIG. 1.

The graphene sheet 100 includes 1 to 20 layered graphene lower sheets 101, and ridges 102 formed on the lower sheet 101 and including more graphene layers than the lower sheet 101, wherein the ridges 102 may have a metal grain boundary shape.

Each ridge 102 may include 3 to 50 graphene layers.

The ridge 102 may have a metal grain shape as shown in FIG. 1. Referring to FIG. 1, a dotted line or a solid line indicates the ridge 102, and the rest indicates the lower sheet 101.

The metal grain shape may be irregular and may vary depending on kinds, thickness, condition, and the like (e.g., heat treatment under various conditions) of a metal.

In addition, the ridge 102 may be continuous or discontinuous. In FIG. 1, the solid line indicates a continuous ridge 102, and the dotted line indicates a discontinuous ridge 102.

The lower sheet 101 may include 1 to 20 graphene layers. In addition, the ridge 102 may include 3 to 50 graphene layers.

In particular, the lower sheet 101 may include 1 to 10 graphene layers, while the ridge 102 may include 3 to 30 graphene layers. More particularly, the lower sheet 101 may include 1 to 5 graphene layers, while the ridge 102 may include 3 to 20 graphene layers.

The layer difference between the lower sheet 101 and the ridge 102 will be illustrated in more detail referring to FIG. 2, which is the cross-sectional view of A marked in FIG. 1.

In FIG. 2, the ridge 102 formed along A of FIG. 1 may have as large a gap as the size of a metal grain.

The ridge 102 has the above structure, because a graphene sheet is prepared in a diffusion method using a polycrystalline metal thin film and/or a metal foil.

The polycrystalline metal thin film and/or metal foil has an intrinsic polycrystalline metal grain, and accordingly, carbon atoms are diffused faster along the metal grain boundary than through the lattice structure inside the grain at a low temperature, forming the ridge (102) structure. A method of manufacturing a graphene sheet according to one embodiment of the present invention will be illustrated in more detail later.

The metal grain may have a size ranging from 10 nm to 10 mm, 50 nm to 1 mm, or 50 nm to 200 μm.

More particularly, the metal grain may have a size ranging from 10 nm to 10 mm, 10 nm to 500 μm, or 50 nm to 10 μm.

The metal grain may be controlled regarding size depending on kinds of a metal, its heat treatment temperature and heat treatment ambient, but is not limited thereto.

In particular, the metal grain may have various sizes depending on a method of a graphene sheet according to one embodiment of the present invention.

For example, when a metal thin film is used to prepare a graphene sheet according to one embodiment of the present invention, the metal may have a grain size ranging from 10 nm to 500 μm, 10 nm to 200 μm, 10 nm to 100 μm, or 10 nm to 50 μm.

In addition, when a metal foil is used to prepare a graphene sheet according to one embodiment of the present invention, the metal may have a grain size ranging from 50 nm to 10 mm, 50 nm to 1 mm, or 50 nm to 500 μm. The metal foil is heat-treated separately (ex-situ), and thus may have a larger metal grain size.

The grain size may vary depending on heat treatment temperature and atmosphere of a metal thin film and/or metal foil used in the process of manufacturing a graphene sheet according to one embodiment of the present invention.

The metal may be formed of Ni, Co, Fe, Pt, Au, Al, Cr, Cu, Mg, Mn, Mo, Rh, Si, Ta, Ti, W, U, V, Zr, Zn, Sr, Y, Nb, Tc, Ru, Pd, Ag, Cd, In, Re, Os, Ir, Pb, or a combination thereof, without a particular limit. In addition, the heat treatment may be performed at various temperatures depending on a subject substrate on which the graphene sheet is deposited. Furthermore, the heat treatment may be performed under a vacuum atmosphere or by flowing an inert gas such as Ar and $N_2$, a gas such as $H_2$, $O_2$, and the like, and a mixture thereof. In particular, $H_2$ may be used to increase the size of a grain.

In particular, when a graphene sheet is deposited on an inorganic material substrate, the inorganic material substrate in general may have excellent thermal characteristics and strong abrasion resistance, and accordingly, a metal thin film and/or metal foil thereon may be heat-treated at about 1000° C. under a $H_2$ atmosphere to increase the size of a grain. A graphene sheet formed in the aforementioned method may have a ridge 102 with a gap ranging from several microns to several millimeters. In particular, the ridge may have a gap ranging from 1 µm to 500 µm, 5 µm to 200 µm, or 10 µm to 100 µm.

However, when the inorganic material substrate is heat-treated at a lower temperature, a metal thin film and/or metal foil thereon may have a relatively small grain size. Accordingly, a ridge 102 in the metal thin film and/or metal foil may have a smaller gap ranging from tens of nanometers to tens of microns.

For another example, when a graphene sheet is deposited on an organic material substrate, a metal thin film and/or metal foil may be heat-treated at about 200° C. or less, since the organic material substrate is generally weak against heat. The metal thin film and/or metal foil may have a relatively smaller metal grain size, and thus forms a ridge 102 with a gap ranging from tens of nanometers to hundreds of nanometers. In particular, the ridge 102 may have a gap ranging from 10 nm to 900 nm, 30 nm to 500 nm, or 50 nm to 500 nm.

However, when a metal foil is heat-treated first and applied on a subject substrate, the heat treatment may be performed regardless of the subject substrate. Herein, a ridge 102 in the metal foil may have a gap ranging from hundreds of nanometers to tens of millimeters. In particular, the gap may be in a range 100 µm to 10 mm, 100 µm to 1 mm, or 100 µm to 500 µm.

The subject substrate may be a Group IV semiconductor substrate such as Si, Ge, SiGe, and the like; a Group III-V compound semiconductor substrate such as GaN, AlN, GaAs, AlAs, GaP, and the like; a Group II-VI compound semiconductor substrate such as ZnS, ZnSe, and the like; an oxide semiconductor substrate such as ZnO, MgO, sapphire, and the like; another insulator substrate such as glass, quartz, $SiO_2$, and the like; an organic material substrate such as polymer, liquid crystal, and the like; and the like.

The subject substrate may include any substrate if the substrate is used for a display device, an optoelectronic/electronic device, a battery, or a solar cell, and for a transistor, a sensor, or an organic/inorganic semiconductor device.

The lower sheet 101 may be even on the surface. In other words, the lower sheet 101 may have no wrinkles, ripples, or the like.

According to one embodiment of the present invention, the lower sheet 101 of a graphene sheet may be prepared in a different method from a conventional chemical vapor deposition (CVD) method, and is thus even on the surface.

A conventional chemical vapor deposition (CVD) method includes providing a carbon material on a metal at about 1000° C. and sharply dropping the temperature to room temperature.

In this way, when the temperature of a substrate is sharply dropped, a graphene sheet on the substrate may be wrinkled. The reason is that a metal and graphene have different thermal expansion coefficients.

On the contrary, the graphene according to one embodiment of the present invention may be prepared without a sharp temperature change unlike the chemical vapor deposition (CVD) method, and thus, its lower sheet 101 may be even.

The graphene sheet may have transparency of 60% or more, particularly, 80% or more, more particularly, 85% or more, and much more particularly, 90% or more. When the graphene sheet has transparency within the range, the graphene sheet may be appropriately used as an electron material for a transparent electrode and the like.

The graphene sheet may have sheet resistance of 2000 Ω/square or less, particularly, 1000 Ω/square or less, more particularly, 274 Ω/square or less, and much more particularly, 100 Ω/square or less. According to one embodiment of the present invention, a graphene sheet may include an even lower sheet 101 with no wrinkles, and thus has low sheet resistance. When the graphene sheet has sheet resistance within the range, it may be usefully applied to an electronic material for an electrode and the like.

According to another embodiment of the present invention, provided is a method of manufacturing the graphene sheet which may include (a) preparing a subject substrate, (b) providing a metal foil on the subject substrate, (c) providing a carbon source material on the metal foil, (d) heating the carbon source material, the subject substrate, and the metal foil, (e) diffusing carbon atoms that are decomposed and generated from the heated carbon source material into the metal foil, and (f) forming a graphene sheet on the subject substrate with the carbon atoms.

The substrate may be, for example, a Group IV semiconductor substrate such as Si, Ge, SiGe, and the like; a Group III-V compound semiconductor substrate such as GaN, AlN, GaAs, AlAs, GaP, and the like; a Group II-VI compound semiconductor substrate such as ZnS, ZnSe, and the like; an oxide semiconductor substrate such as ZnO, MgO, sapphire, and the like; other insulator substrates such as glass, quartz, $SiO_2$, and the like; or an organic material substrate such as a polymer, a liquid crystal, and the like. The substrate may include any substrate generally used for a display device, an optoelectronic/electronic device, a battery, or a solar cell, and a substrate used for a transistor, a sensor, or an organic/inorganic semiconductor device, without any particular limit.

A metal foil is provided on the subject substrate. The metal foil may work as a catalyst when a carbon source material is provided in the next step, promote decomposition of the carbon source material into carbon atoms at a relatively low temperature, and then provide a passage through which the carbon atoms can be diffused into the subject substrate.

The metal foil is paper-thin and made of a metal, and in general is very flexible.

The metal foil may be formed of a metal selected from Ni, Co, Fe, Pt, Au, Al, Cr, Cu, Mg, Mn, Mo, Rh, Si, Ta, Ti, W, U, V, Zr, Zn, Sr, Y, Nb, Tc, Ru, Pd, Ag, Cd, In, Re, Os, Ir, Pb, or a combination thereof.

The metal foil may be a commercially available metal foil or may be formed in a common method of plating, deposition, and the like. The metal foil may have a thickness ranging from several microns to several millimeters and a grain size ranging from tens of nanometers to tens of microns.

However, a metal foil with a thickness of several microns or less may be used if necessary. When a metal foil has a thickness within the range, it may form graphene due to diffusion of carbon atoms.

The carbon source material supplied in the step (c) may have a vapor phase, a liquid phase, a solid phase, or a combination thereof. Particularly, the vapor carbon source material may include methane, ethane, propane, butane, isobutane, pentane, isopentane, neopentane, hexane, heptane, octane, nonane, decane, methene, ethene, propene, butene, pentene, hexene, heptene, octene, nonene, decene, ethyne, propyne, butyne, pentyne, hexyne, heptyne, octyne, nonyne, decyne, cyclomethane, cycloethine, cyclobutane, methylcyclopropane, cyclopentane, methylcyclobutane, ethylcyclopropane, cyclohexane, methylcyclopentane, ethylcyclobutane, propylcyclopropane, cycloheptane, methylcyclohexane, cyclooctane, cyclononane, cyclodecane, methylene, ethediene, allene, butadiene, pentadiene, isopyrene, hexadiene, heptadiene, octadiene, nonadiene, decadiene, and the like. The solid-phased carbon source material may be highly-oriented pyrolytic graphite, graphite, amorphous carbon, diamond, spin-coated polymer source material, and the like. The liquid carbon source material may be a gel prepared by breaking a solid-phase carbon source such as graphite, a highly-oriented pyrolytic graphite (HOPG) substrate, amorphous carbon, and the like into pieces and dissolving it in various alcohol solvents such as acetone, methanol, ethanol, pentanol, ethylene glycol, glycerin, and the like. The solid-phase carbon material may have a size ranging from 1 nm to 100 cm, 1 nm to 1 mm, or specifically, 1 nm to 100 µm.

The heating in the step (d) may be performed from room temperature to 1500° C., 30° C. to 1000° C., 30° C. to 800° C., or in particular, from 50° C. to 600° C. These temperature ranges are remarkably lower than a temperature range for preparing a graphene thin film in a chemical vapor deposition (CVD) method. A heat treatment within the temperature range may be more advantageous than a conventional method in terms of cost, and may prevent transformation of a subject substrate due to heat-treatment at a high temperature. The highest temperature may be lower depending on the subject substrate.

In the specification, room temperature indicates a temperature at which the manufacturing method is generally performed. Accordingly, the room temperature range may vary depending on season, location, internal condition, and the like.

In addition, the heating may be performed for 1 second to 10 hours, 1 second to 1 hour, or in particular, for 2 seconds to 20 minutes. The heating may be maintained for 1 second to 100 hours, 1 second to 10 hours, or in particular, for 5 seconds to 3 hours.

The hating may be performed at a speed ranging from 0.1° C./sec to 500° C./sec, 0.3° C./sec to 300° C./sec, or in particular, from 0.5° C./sec to 100° C./sec.

The heating temperature may be more appropriate when a carbon source material is a liquid or a solid.

For example, when a carbon source material is a gas, it may be heated within the following heating temperature range.

The heating temperature may be within a range of room temperature to 1500° C., 300 to 1200° C., or in particular, 500 to 1000° C.

In addition, the heating may be performed for 1 second to 10 hours, 1 second to 1 hour, or in particular, for 2 seconds to 30 minutes. The heating may be maintained for 1 second to 100 hours, 1 second to 10 hours, or in particular, for 1 minute to 5 hours.

The heating may be performed at a speed ranging from 0.1° C./sec to 500° C./sec, 0.3° C./sec to 300° C./sec, or in particular, from 0.5° C./sec to 100° C./sec.

The heating temperature and time may be regulated to prepare a desired graphene. In addition, the heating temperature and time may be controlled to adjust the thickness of the graphene.

Carbon atoms thermally decomposed from the carbon source material on the metal foil may be diffused into the metal foil. Herein, the carbon atoms are spontaneously diffused according to the carbon concentration gradient.

A metal-carbon-based system may have several percent of carbon solubility in a metal and is thermally decomposed into each carbon atom at a low temperature due to catalyst effects of a metal foil, and the carbon atoms are dissolved into the metal foil. The dissolved carbon atoms are diffused on the surface of the metal foil, and then inside the metal foil according to the concentration gradient. Then, when carbon atoms inside the metal foil reach certain solubility at the bottom surface of the subject substrate, graphene with a stable phase is precipitated on the other surface of the metal foil. Accordingly, a graphene sheet is formed between the subject substrate and the metal foil.

On the other hand, when a metal foil contacts a carbon source material, the metal foil works as a catalyst and promotes decomposition of the carbon source material. As a result, the decomposed carbon atoms may be spontaneously diffused through dislocation, the grain boundary, or the like according to the concentration gradient and exist inside the polycrystalline metal foil in a large amount.

Accordingly, the carbon atoms spontaneously reach the subject substrate and are then laterally diffused along the interface of the meal foil with the subject substrate and form a graphene sheet.

The diffusion of the carbon atoms into the metal foil may vary depending on the kinds of the aforementioned carbon source material and heating conditions.

The heating may be controlled regarding temperature, time, and speed to the number of layers in a graphene sheet. Accordingly, a graphene sheet may have more than one layer.

The graphene sheet may have a thickness of a single graphene layer, about 0.1 nm, to about 100 nm, preferably from 0.1 nm to 10 nm, and more preferably from 0.1 to 5 nm. When the graphene sheet has a thickness of more than 100 nm, it may be defined as graphite rather than as a graphene sheet, which is beyond the range of the present invention.

When a graphene sheet is formed on the subject substrate, the metal foil is removed. If some of the metal foil is not removed, the remaining amount may be completely removed with an organic solvent and the like. During this process, the remaining carbon source material may be removed. The organic solvent may include hydrochloric acid, nitric acid, sulfuric acid, iron chloride, pentane, cyclopentane, hexane, cyclohexane, benzene, toluene, 1,4-dioxane, methylene chloride ($CHCl_3$), diethylether, dichloromethane, tetrahydrofuran, ethylacetate, acetone, dimethyl formamide, acetonitrile, dimethylsulfoxide, formic acid, n-butanol, isopropanol, m-propanol, ethanol, methanol, acetic acid, distilled water, and the like.

However, when the metal foil is patterned before supplying a carbon source material, the graphene sheet is prepared to have a desired shape. The patterning method may include any common patterning used in a related field.

In addition, a metal foil may be heat-treated and spontaneously patterned before supplying a carbon source material. In general, when a thin metal foil supplied on a subject substrate is heat-treated at a high temperature, metal atoms actively move and transform the two-dimensional structure of the metal foil into a three-dimensional structure. Accordingly, a graphene sheet is selectively deposited on a subject substrate.

The subject substrate may be flexible.

Since the metal foil is also flexible, graphene may be formed with a wrinkle on a flexible subject substrate.

The flexible substrate may be a plastic such as polystyrene, polyvinyl chloride, nylon, polypropylene, acryl, phenol, melamine, epoxy, polycarbonate, polymethylmethacrylate, polymethyl(meth)acrylate, polyethylmethacrylate, polyethyl(meth)acrylate, and the like, liquid crystal, glass, quartz, rubber, paper, and the like, without limitation.

According to another embodiment of the present invention, provided is a method of manufacturing a graphene sheet, which includes (a) preparing a subject substrate; (b) supplying a metal foil on the subject substrate and heat-treating the subject substrate to increase a grain size; (c) supplying a carbon source material on the metal foil; (d) heating the carbon source material, the subject substrate, and the metal foil; (e) thermally decomposing the heated carbon source material into carbon atoms and diffusing the carbon atoms into the metal foil; and (f) forming a graphene sheet on the subject substrate with the carbon atoms diffused into the metal foil.

According to another embodiment of the present invention, the method may further include heat treatment of a metal foil after supplying the metal foil in the step (b) to increase the grain size.

Since the metal foil originally has a relatively small grain size, the metal foil may have a larger grain size as well as adjusted grain orientation through the heat-treatment under a particular atmosphere such as ultra-high vacuum, hydrogen, or the like.

Herein, the heat treatment conditions may vary depending on the kinds of the subject substrate.

When a subject substrate is made of an inorganic material like a semiconductor substrate such as Si, GaAs, and the like, or an insulator substrate such as $SiO_2$ and the like, the heating may be performed at a temperature ranging from 400° C. to 1400° C., 400° C. to 1200° C., or in particular, 600° C. to 1200° C.

The heating time may be in a range of 1 second to 10 hours, 1 second to 1 hour, or in particular, 3 seconds to 30 minutes.

The heating may be maintained for 10 seconds to 10 hours, 30 seconds to 3 hours, or in particular, for 1 minute to 1 hour.

The heating speed may be in a range of 0.1° C./sec to 100° C./sec, 0.3° C./sec to 30° C./sec, or in particular, from 0.5° C./sec to 10° C./sec.

The heating may be performed under a vacuum atmosphere or by flowing an inert gas such as Ar and $N_2$, a gas such as $H_2$ and $O_2$, and the like, and a mixture thereof. In particular, the $H_2$ may be used to increase a grain size.

When a subject substrate is made of an organic material such as a polymer, liquid crystal, and the like, the heating may be performed at a temperature ranging from 30° C. to 500° C., 30° C. to 400° C., or in particular, 50° C. to 300° C.

The heating time may be in a range of 1 second to 10 hours, 1 second to 30 minutes, or in particular, 3 seconds to 10 minutes.

The heating may be maintained for 10 seconds to 10 hours, 30 seconds to 5 hours, or in particular, 1 minute to 1 hour.

The heating speed is in a range of 0.1° C./sec to 100° C./sec, 0.3° C./sec to 30° C./sec, or in particular, 0.5° C./sec to 10° C./sec.

As aforementioned, the heating may be performed under a vacuum atmosphere or by flowing an inert gas such as Ar and $N_2$, a gas such as $H_2$ and $O_2$, and the like, and a mixture thereof. In particular, the $H_2$ may be used to increase a grain size.

When a metal foil is heat-treated in the above method, the metal foil may have a 2 to 1000 times larger grain size.

The other components are the same as aforementioned and will not be illustrated.

According to the embodiment of the present invention, the method of manufacturing a graphene sheet may provide a large graphene sheet with a size of several millimeters to several centimeters or more by using a liquid and/or a solid carbon material at a low temperature.

In addition, a graphene sheet may be directly formed on a semiconductor, an insulator, and an organic material substrate without a transferring process.

For example, when a graphene sheet prepared in a method according to one embodiment of the present invention is used as an active layer for a conventional Si-based TFT, equipment that is sensitive to temperature in a conventional Si process may be used.

Since the graphene can directly grow on a substrate at a low temperature without transferring even in mass production, it may bring about economic profits and yield improvement in quality. Particularly, since graphene may be easily wrinkled, torn, and the like as it becomes larger, the transferring process may need to be omitted in mass production.

In addition, a carbon source material used in the method of manufacturing graphene costs much less than a conventional carbonized gas with high purity.

According to another embodiment of the present invention, provided is a method which includes (a) preparing a subject substrate; (b) supplying a metal foil on the subject substrate; (c) heating the subject substrate and the metal foil; (d) supplying a carbon source material on the metal foil; (e) thermally decomposing the carbon source material into carbon atoms and diffusing the carbon atoms into the metal foil; and (f) forming a graphene sheet on the subject substrate with the carbon atoms.

The manufacturing method may differ from the aforementioned method according to one embodiment of the present invention in order of (c) heating a subject substrate and a metal foil, and (d) supplying a carbon source material on the metal foil.

The heating (c) may be performed in a temperature range of room temperature to 1500° C., 300 to 1200° C., or in particular, 300 to 1000° C. These temperature ranges are remarkably lower than a temperature for preparing a graphene thin film in a chemical vapor deposition (CVD) method. The heating within the temperature range may advantageously cost less than a conventional process and prevents transformation of a subject substrate at a high temperature.

In addition, the heating may be performed for 1 second to 10 hours, 1 second to 1 hour, or in particular, 2 seconds to 30 minutes. The heating may be maintained for 1 second to 100 hours, 1 second to 10 hours, or in particular, 1 minute to 3 hours.

The heating speed may be in a range of 0.1° C./sec to 500° C./sec, or in particular, 0.5° C./sec to 100° C./sec.

The heating temperature and time are adjusted to prepare a desired graphene sheet. In addition, the heating temperature and time may be adjusted to control the thickness of the graphene sheet.

The heating conditions may be more appropriate when the carbon source material is a gas.

The other components are the same as a method of manufacturing graphene according to one embodiment of the present invention.

According to another embodiment of the present invention, provided is a method of manufacturing a graphene sheet which includes (a) preparing a subject substrate; (b) supplying a metal foil on the subject substrate and heat-treating the metal foil and the subject substrate to increase the grain size of the metal foil; (c) heating the subject substrate and the metal foil; (d) supplying a carbon source material on the metal foil; (e) thermally decomposing the carbon source material into carbon atoms and diffusing the carbon atoms into the metal foil; and (f) forming a graphene sheet on the subject substrate with the carbon atoms.

According to another embodiment of the present invention, the method may include heat-treating a metal foil to increase its grain size after supplying the metal foil in the step (b).

Since the metal foil has a relatively small grain size, it may be heat-treated under a particular atmosphere such as ultra-high vacuum, a hydrogen atmosphere, or the like to increase the grain size and to simultaneously adjust the grain orientation.

Herein, the heat treatment may be performed under various conditions depending on the kinds of a subject substrate.

First of all, when a subject substrate is formed of an inorganic material, for example, a semiconductor substrate such as Si, GaAs, and the like and an insulator substrate such as $SiO_2$ and the like, the heat treatment may be performed at a temperature ranging from 400° C. to 1400° C., 400° C. to 1200° C., or in particular, 600° C. to 1200° C.

The heat treatment may be performed for 1 sec to 10 hour, 1 sec to 1 hour, or in particular, 3 sec to 30 min.

Then, the heat treatment may be maintained for 10 sec to 10 hour, 30 sec to 3 hours, or in particular, 1 min to 1 hour.

The heat treatment may be performed at a speed ranging from 0.1° C./sec to 100° C./sec, 0.3° C./sec to 30° C./sec, or in particular, 0.5° C./sec to 10° C./sec.

The heat treatment may be performed under vacuum or by flowing an inert gas such as Ar, $N_2$, and the like, gas such as $H_2$, $O_2$, and the like, and a mixture thereof. In particular, the $H_2$ may be usefully applied to increase a grain size.

When a subject substrate is made of an organic material such as polymer, liquid crystal, and the like, the heat treatment may be performed in a range of 30° C. to 500° C., 30° C. to 400° C., or in particular, 50° C. to 300° C.

The heat treatment may be performed for 1 sec to 10 hours, 1 sec to 30 min, or in particular, 3 sec to 10 min.

The heat treatment may be maintained at a temperature ranging from 10 sec to 10 hours, 30 sec to 5 hours, or in particular, 1 min to 1 hour.

The heat treatment may be performed at a speed ranging from 0.1° C./sec to 100° C./sec, 0.3° C./sec to 30° C./sec or in particular, 0.5° C./sec to 10° C./sec.

As aforementioned, the heating may be performed under vacuum or by flowing inert gas such as Ar, $N_2$, and the like, gas such as $H_2$, $O_2$, and the like, and a mixture thereof. In particular, $H_2$ may be usefully applied to increase a grain size.

When a metal foil is heat-treated in the above method, the grains in the metal foil may be about 2 to 1000 times larger.

The other components are the same as the aforementioned embodiment of the present invention and will not be illustrated.

According to another embodiment of the present invention, provided is a method of manufacturing a graphene sheet, which includes (a) preparing a subject substrate and a metal foil; (b) heat-treating the metal foil to increase its grain size; (c) supplying the metal foil with a larger grain size on the subject substrate; (d) supplying a carbon source material on the metal foil; (e) heating the carbon source material, the subject substrate, and the metal foil; (f) thermally decomposing the carbon source material into carbon atoms and diffusing the carbon atoms into the metal foil; and (g) forming a graphene sheet on the subject substrate with the carbon atoms.

Since the metal foil has a relatively smaller grain size, it is heat-treated under a particular atmosphere like high vacuum, a hydrogen atmosphere, or the like to increase its grain size and simultaneously adjust its orientation.

The heat treatment to increase the grain size of the metal foil may be separately performed from that of a subject substrate. When the metal foil is separately heat-treated from a subject substrate, damage to the subject substrate due to the heat treatment may be minimized.

Herein, the heat treatment is performed under the following conditions.

The heat treatment may be performed at a temperature ranging from 50° C. to 3000° C., 500° C. to 2000° C., or in particular, 500° C. to 1500° C. The temperature may vary depending on kinds of a metal foil. The highest temperature may be lower than the melting point of the metal foil.

The heat treatment may be performed for 1 second to 10 hours, 1 second to 1 hour, or in particular, 1 second to 30 minutes.

The heating may be maintained for 10 seconds to 10 hours, 30 seconds to 5 hours, or in particular, 1 minute to 3 hours.

The heating may be performed at a speed ranging from 0.1° C./sec to 500° C./sec, 0.3° C./sec to 50° C./sec, or in particular, 0.5° C./sec to 10° C./sec.

In addition, the heating may be performed under vacuum or by flowing an inert gas such as Ar, $N_2$, and the like, a gas such as $H_2$, $O_2$, and the like, and a mixture thereof. In particular, $H_2$ is usefully applied to increase a grain size.

When a metal foil is heat-treated in the aforementioned method, it may have a grain with a larger size of hundreds of microns to tens of millimeters.

Accordingly, the metal foil with a larger grain size may be supplied on the subject substrate.

The metal foil may work as a catalyst when a carbon source material is supplied thereon in the next step, and thus promote decomposition of a carbon source material at a relatively low temperature and provide a passage through which carbon atoms decomposed from the carbon source material may be diffused into a subject substrate.

Then, a carbon source material may be supplied on the metal foil.

The heat treatment in the step (e) may be performed at a temperature ranging from a room temperature to 1500° C., 30° C. to 1000° C., or in particular, 50° C. to 800° C. The temperature is remarkably lower than the temperature for preparing a graphene thin film in a chemical vapor deposition (CVD) method. The heat treatment within the temperature range may be advantageous in terms of cost compared with a conventional process, and also prevents transformation of a subject substrate at a high temperature. The highest temperature in the heat treatment may be lower depending on a subject substrate.

In addition, the heating time may be in a range of 1 second to 10 hours, 1 second to 1 hour, or in particular, 2 seconds to 30 minutes. The heating may be maintained for 1 second to 100 hours, 1 second to 10 hours, or in particular, 5 seconds to 3 hours.

The heating may be performed at a speed ranging from 0.1° C./sec to 500° C./sec, 0.3° C./sec to 300° C./sec, or in particular, 0.5° C./sec to 100° C./sec.

The heating temperature may be appropriate when a carbon source material is a liquid or solid.

For example, when a carbon source material is a gas, the heating may be performed under the following conditions.

The heating may be performed at a temperature ranging from room temperature to 1500° C., 300 to 1200° C., or in particular, 500 to 1000° C.

In addition, the heating may be performed for 1 second to 10 hours, 1 second to 1 hour, or in particular, 2 seconds to 30 minutes. Then, the heating may be maintained for 1 second to 100 hours, 1 second to 10 hours or in particular, 1 minute to 5 hours.

The heating speed may be in a range of 0.1° C./sec to 500° C./sec, 0.3° C./sec to 300° C./sec, or in particular, 0.5° C./sec to 100° C./sec.

The heating temperature and time are adjusted to prepare a desired graphene sheet. In addition, the temperature and time may be adjusted to control the thickness of the graphene sheet.

Next, carbon atoms thermally decomposed from the carbon source material on the metal foil may be diffused into the metal foil. The diffusion may spontaneously occur according to a carbon concentration gradient.

According to another embodiment of the present invention, provided is a method of manufacturing a graphene sheet, which includes (a) preparing a subject substrate and a metal foil; (b) heat-treating the metal foil to increase its grain size; (c) supplying the metal foil with a larger grain size on the subject substrate; (d) heating the subject substrate and the metal foil; (e) supplying a carbon source material on the metal foil; (f) thermally decomposing the carbon source material into carbon atoms and diffusing the carbon atoms into the metal foil; and (g) forming a graphene sheet on the subject substrate with the diffused carbon atoms.

This manufacturing method has a different order of (d) heating a subject substrate and a metal foil and (d) supplying a carbon source material on the metal foil compared with the aforementioned method according to one embodiment of the present invention.

The heating in the step (d) may be performed at a temperature ranging from room temperature to 1500° C., 300 to 1200° C., or in particular, 300 to 1000° C. The temperature is remarkably lower than the temperature for forming a graphene sheet in a chemical vapor deposition (CVD) method. The heating within the temperature range in this method may be more advantageous in terms of cost than that of a conventional method, and also prevents transformation of a subject substrate at a high temperature.

In addition, the heating may be performed for 1 second to 10 hours, 1 second to 1 hour, or in particular, 2 seconds to 30 minutes. The heating may be maintained for 1 second to 100 hours, 1 second to 10 hours, or in particular, 1 minute to 3 hours.

The heating may be performed at a speed ranging from 0.1° C./sec to 500° C./sec, or in particular, 0.5° C./sec to 100° C./sec.

The heating temperature and time are adjusted to prepare a graphene sheet. In addition, the heating temperature and time are adjusted to control the thickness of the graphene sheet.

The heating condition may be appropriate when a carbon source material is a gas.

The other components are the same as illustrated in a method of manufacturing a graphene sheet according to one embodiment of the present invention.

According to one embodiment of the present invention, provided is a method including (a) preparing a subject substrate, (b) forming a metal thin film on the subject substrate and heat-treating the metal thin film to increase the grain size of the metal thin film, (c) supplying a carbon source material on the metal thin film, (d) heat-treating the carbon source material, the subject substrate, and the metal thin film, (e) thermally decomposing the carbon source material into carbon atoms and diffusing the carbon atoms into the metal thin film, and (f) forming a graphene sheet on the subject substrate with the diffused carbon atoms.

The subject substrate is the same as one according to one embodiment of the present invention, and thus will not be illustrated.

Next, a metal thin film is formed on the subject substrate. The metal thin film may work as a catalyst when a carbon source material is supplied thereon in the next step, and promotes the carbon source material to be decomposed at a relatively lower temperature. The carbon source material is decomposed into carbon atoms, and the carbon atoms exist on the metal thin film. When a gaseous carbon source material is decomposed, a remaining hydrogen group may be released as hydrogen gas.

The metal thin film may include at least one metal selected from the group consisting of Ni, Co, Fe, Pt, Au, Al, Cr, Cu, Mg, Mn, Mo, Rh, Si, Ta, Ti, W, U, V, Zr, Zn, Sr, Y, Nb, Tc, Ru, Pd, Ag, Cd, In, Re, Os, Ir, and Pb.

The metal thin film may be formed using a vapor deposition method such as evaporation, sputtering, chemical vapor deposition (CVD), and the like.

When a metal thin film is deposited on the subject substrate, the deposition may vary depending on kinds of the subject substrate.

When a metal thin film is deposited on an inorganic material substrate such as a semiconductor substrate made of Si, GaAs, and the like, an insulator substrate made of $SiO_2$ and the like, or the like, the metal thin film and the substrate may be heated at a temperature ranging from room temperature to 1200° C., or in particular, room temperature to 1000° C.

The heating may be performed for 1 second to 10 hours, 1 second to 30 minutes, or in particular, 3 seconds to 10 minutes.

The heating may be maintained for 10 second to 10 hours, 30 seconds to 3 hours, or in particular, 30 seconds to 90 minutes.

The heating may be performed at a speed ranging from 0.1° C./sec to 100° C./sec, 0.3° C./sec to 30° C./sec, or in particular, 0.5° C./sec to 10° C./sec.

In addition, when a metal thin film is deposited an organic material substrate such as a polymer, liquid crystal, and the like, the metal thin film and the substrate may be heated at a temperature ranging from room temperature to 400° C., room temperature to 200° C., or in particular, room temperature to 150° C.

The heating may be performed for 1 second to 2 hours, 1 second to 20 min, or in particular, 3 seconds to 10 minutes.

Then, the heating may be maintained for 10 seconds to 10 hours, 30 seconds to 3 hours, or in particular, 30 seconds to 90 minutes.

The heating speed is in a range of 0.1° C./sec to 100° C./sec, 0.3° C./sec to 30° C./sec, or in particular, 0.5° C./sec to 10° C./sec.

The metal thin film may have various grain sizes depending on kinds of a lower subject substrate and the deposition conditions.

When the lower subject substrate is a semiconductor substrate made of Si, GaAs, and the like with excellent crystallinity, a grain may have a size ranging from tens of nanometers (at room temperature) to several microns (at 1000° C.) depending on the deposition temperature. When the lower subject substrate is amorphous such as $SiO_2$, a grain may have a size ranging from several nanometers (at room temperature) to hundreds of nanometers (at 1000° C.). When the lower subject substrate is made of an organic material such as a polymer and liquid crystal, a grain may have a size ranging from several nanometers (at room temperature) to hundreds of nanometers (at 400° C.).

Since the deposited metal thin film has a relatively small grain size, it may be heat-treated under a particular atmosphere such as ultra-high vacuum or hydrogen to increase grain size and simultaneously to adjust grain orientation.

Herein, the heat treatment conditions may vary depending on kinds of a subject substrate.

When a subject substrate is formed of an inorganic material, for example, a semiconductor substrate made of Si, GaAs, and the like, or an insulator substrate made of $SiO_2$, it may be heated at a temperature ranging from 400° C. to 1400° C., 400° C. to 1200° C., or in particular, 600° C. to 1200° C.

The heating may be performed for 1 second to 10 hours, 1 second to 30 min, or in particular, 3 seconds to 10 minutes.

The heating may be maintained for 10 second to 10 hours, 30 seconds to 1 hour, or in particular, 1 minute to 20 minutes.

The heating speed may be in a range of 0.1° C./sec to 100° C./sec, 0.3° C./sec to 30° C./sec, or in particular, 0.5° C./sec to 10° C./sec.

The heating may be performed under vacuum or by flowing an inert gas such as Ar and $N_2$, a gas such as $H_2$ and $O_2$, and the like, and a mixture thereof. In particular, $H_2$ may be usefully applied to increase the grain size of a metal thin film.

When a subject substrate is made of an organic material such as a polymer, liquid crystal, and the like, the heating may be performed at a temperature ranging from 30° C. to 400° C., 30° C. to 300° C., or in particular, 50° C. to 200° C.

The heating may be performed for 1 second to 10 hours, 1 second to 30 minutes, or in particular, 3 seconds to 5 minutes.

The heating may be maintained for 10 seconds to 10 hours, 30 seconds to 1 hour, or in particular, 1 minute to 20 minutes.

The heating speed may be in a range of 0.1° C./sec to 100° C./sec, 0.3° C./sec to 30° C./sec, or in particular, 0.5° C./sec to 10° C./sec.

In addition, the heating may be performed under vacuum or by flowing an inert gas such as Ar and $N_2$, a gas such as $H_2$ and $O_2$, and the like, and a mixture thereof. In particular, $H_2$ may be usefully applied to increase a grain size.

When a metal thin film is heat-treated in the same method, the metal thin film may have a 2 to 1000 times larger grain size.

The metal thin film may have a thickness ranging 1 nm to 10 μm, 10 nm to 1 μm, or in particular, 30 nm to 500 nm. When a metal thin film has a thickness within the range, carbon atoms may be diffused and form a graphene sheet.

The carbon source material supplied in the step (c) may be a gas, liquid, solid, or a combination thereof. For example, the gaseous carbon source material may include methane, ethane, propane, butane, isobutane, pentane, isopentane, neopentane, hexane, heptane, octane, nonane, decane, methene, ethene, propene, butene, pentene, hexene, heptene, octene, nonene, decene, ethyne, propyne, butyne, pentyne, hexyne, heptyne, octyne, nonyne, decyne, cyclomethane, cycloethine, cyclobutane, methylcyclopropane, cyclopentane, methylcyclobutane, ethylcyclopropane, cyclohexane, methylcyclopentane, ethylcyclobutane, propylcyclopropane, cycloheptane, methylcyclohexane, cyclooctane, cyclononane, cyclodecane, methylene, ethediene, allene, butadiene, pentadiene, isoprene, hexadiene, heptadiene, octadiene, nonadiene, decadiene, and the like. The solid carbon source material may include highly-oriented pyrolytic graphite, graphite, amorphous carbon, diamond, a spin-coated polymer, and the like. The liquid carbon source material may include graphite, a highly-oriented pyrolytic graphite (HOPG) substrate, a gel-type material prepared by grinding a solid carbon source material such as amorphous carbon and the like and then dissolving it in various alcohol solvents such as acetone, methanol, ethanol, pentanol, ethylene glycol, glycerine, and the like. The solid carbon source material may have a size ranging from 1 nm to 100 cm, 1 nm to 1 mm, or in particular, 1 nm to 100 μm.

The heating in the step (d) may be performed at a temperature ranging from room temperature to 1000° C., 30° C. to 600° C., or in particular, 35 to 300° C. This temperature may be remarkably lower than that for preparing a graphene thin film in a common chemical vapor deposition (CVD) method. The heat treatment within the temperature range may be more advantageous in terms of cost than a conventional process, and also prevents transformation of a subject substrate at a high temperature.

In addition, the heat treatment may be performed for 1 second to 10 hours, 1 second to 30 minutes, or in particular, 2 seconds to 10 minutes. The heat treatment may be maintained for 10 seconds to 10 hours, 30 seconds to 1 hour, or in particular, 1 minute to 20 minutes.

The heating speed may be in a range of 0.1° C./sec to 100° C./sec, 0.3° C./sec to 30° C./sec, or in particular, 0.5° C./sec to 10° C./sec.

The heating temperature may be more appropriate for a liquid or solid carbon source material.

For example, a gaseous carbon source material may be heated under the following conditions.

The heating may be performed at a temperature ranging from 300 to 1400° C., 500 to 1200° C., or in particular, 500 to 1000° C.

In addition, the heating may be performed for 1 second to 24 hours, 1 second to 3 hours, or in particular, 2 seconds to 1 hour. Then, the heating may be maintained for 10 seconds to 24 hours, 30 seconds to 1 hour, or in particular, 1 minute to 30 minutes.

The heating speed may be in a range of 0.1° C./sec to 500° C./sec, 0.3° C./sec to 300° C./sec, or in particular, 0.3° C./sec to 100° C./sec.

The heating temperature and time may be controlled to form a desired graphene sheet. In addition, the temperature and time may be adjusted to control the thickness of the graphene sheet.

Carbon atoms thermally decomposed from the carbon source material on the metal thin film may be diffused into the metal thin film. The diffusion may spontaneously occur according to the carbon concentration gradient.

A metal-carbon-based material has several percent or so of solubility of carbon atoms, and is dissolved on the surface of a metal thin film. The dissolved carbon atoms are diffused on one surface of a metal thin film and then inside the metal thin film according to the concentration gradient. When carbon atoms reach a certain solubility inside a metal thin film, graphene is precipitated on the other side of the metal thin film. Accordingly, graphene is formed between the subject substrate and the metal thin film.

On the other hand, when a metal thin film contacts a carbon source material, the metal thin film may work as a catalyst and promote decomposition of the carbon source material. As a result, carbon atoms may be spontaneously diffused through dislocation, the grain boundary, or the like according to the concentration gradient and exist in a large amount inside a polycrystalline metal thin film. These carbon atoms reach the subject substrate, are diffused along the interface between the subject substrate and the metal thin film, and form graphene on the interface. The diffusion of carbon atoms may vary depending on kinds and heating conditions of the carbon source material.

The heating temperature, time, and speed may be regulated to control the number of layers in a graphene sheet. The regulation may provide a graphene sheet with multi-layers.

The graphene sheet has one layer and a thickness ranging from 0.1 nm to about 100 nm, preferably, 0.1 to 10 nm, and more preferably, 0.1 to 5 nm. When the grapheme sheet has a thickness of 100 nm or more, it may not be graphene but may be graphite, which is beyond the range of the present invention.

Then, the metal thin film may be removed by an organic solvent and the like. However, a remaining carbon source material may be removed with the metal thin film. The organic solvent may include hydrochloric acid, nitric acid, sulfuric acid, iron chloride, pentane, cyclopentane, hexane, cyclohexane, benzene, toluene, 1,4-dioxane, methylene chloride (CHCl$_3$), diethylether, dichloromethane, tetrahydrofuran, ethylacetate, acetone, dimethyl formamide, acetonitrile, dimethyl sulfoxide, formic acid, n-butanol, isopropanol, m-propanol, ethanol, methanol, acetic acid, distilled water, and the like.

When the metal thin film is patterned before supplying the carbon source material, a graphene sheet having a desired shape may be prepared. The patterning may include any common method used in a related art and thus will not be illustrated in detail.

In addition, before supplying the carbon source material, the metal thin film may be spontaneously patterned due to heat treatment. In general, when a thinly-deposited metal thin film is heat-treated at a high temperature, it may have a structural transformation from a two-dimensional thin film to a three-dimensional thin film due to active movement of metal atoms, which may be used to selectively deposit a grapheme sheet on a subject substrate.

According to another embodiment of the present invention, provided is a method of manufacturing a graphene sheet, which includes (a) preparing a subject substrate, (b) forming a metal thin film on the subject substrate and heat-treating the metal thin film to increase its grain size, (c) heating the subject substrate and the metal thin film, (d) supplying a carbon source material on the metal thin film, (e) thermally decomposing the carbon source material into carbon atoms and diffusing the carbon atoms into the metal thin film, and (f) forming a graphene sheet on the subject substrate with the carbon atoms.

The heating in the step (c) may be performed at a temperature ranging from 400 to 1200° C., 500 to 1000° C., or in particular, 500 to 900° C. This temperature is remarkably lower than a temperature for preparing a graphene thin film in a common chemical vapor deposition (CVD) method. The heating within the temperature range may be more advantageous in terms of cost than in a conventional process, and also prevents transformation of a subject substrate at a high temperature.

In addition, the heating may be performed from 10 seconds to 1 hour, or in particular, 1 minute to 20 minutes. Then, the heating may be maintained for 10 seconds to 24 hours, 30 seconds to 2 hours, or in particular, 1 minute to 1 hour.

The heating speed may be in a range of 0.1° C./sec to 300° C./sec, or in particular, 0.3° C./sec to 100° C./sec.

The heating temperature and time may be controlled to prepare a desired graphene sheet. In addition, the temperature and time may be controlled to adjust the thickness of the graphene sheet.

The heating conditions may be more appropriately applied to a gaseous carbon source material.

The other components may be the same as aforementioned and will not be illustrated.

In addition, the steps (b) and (c) may be simultaneously performed.

According to the embodiment of the present invention, a method of manufacturing a graphene sheet may provide a large graphene sheet by using a liquid and/or solid carbon source material ranging from several millimeters to several centimeters or more.

In addition, the graphene sheet may be formed on a semiconductor, an insulator, and an organic material substrate without a transferring process.

For example, when a graphene sheet prepared in a method of manufacturing the graphene sheet according to one embodiment of the present invention is used as an active layer for a conventional Si-based TFT, equipment that is sensitive to a conventional process temperature and used in a Si process may be used.

When the graphene sheet is industrialized into an active layer and mass produced, the graphene sheet may directly grow on a substrate without a transferring process at a low temperature, and thus bring about huge economic profits and improve yield. In particular, since the graphene sheet may be easily wrinkled, torn, and the like in the transferring process in production of a larger graphene sheet, the transferring process may be necessarily omitted in mass production.

In addition, a carbon source material used in a method of manufacturing a graphene sheet according to one embodiment of the present invention is relatively very inexpensive compared with conventional carbonized gas with high purity.

According to another embodiment of the present invention, provided is a transparent electrode including a graphene sheet according to the aforementioned method.

When the graphene sheet is used as a transparent electrode, the transparent electrode may have excellent electrical characteristics, that is, high conductivity, low contact resistance, and the like. Since the graphene sheet is very thin and flexible, the graphene sheet may be formed into a flexible transparent electrode.

Accordingly, the transparent electrode including the graphene sheet has excellent conductivity even if formed with a thin thickness, which improves transparency.

The transparent electrode may have transparency ranging from 60 to 99.9% and sheet resistance ranging from 1 Ω/sq to 2000 Ω/square.

Transparency and sheet resistance of a graphene sheet according to one embodiment of the present invention may have an influence on transparency and sheet resistance of the transparent electrode.

Since the transparent electrode including the graphene sheet obtained by the method of manufacturing according to one embodiment of the present invention may be prepared in a simple process, it may be extremely economical and have high conductivity and excellent uniformity. In particular, a graphene sheet may be fabricated to have a large area at a low temperature and have a freely regulated thickness, and is thus controlled regarding transparency. In addition, the graphene sheet is flexible and easy to handle, and thus may be applied in a field requiring a flexible transparent electrode.

For example, the transparent electrode including the graphene sheet may be applied to various displays such as a liquid crystal display, an electronic paper display, and an organic/inorganic optoelectronic device, as well as in the battery field such as for a solar cell and the like.

When a transparent electrode according to the present invention is used for the display as aforementioned, the display may be freely folded and is thus more convenient. A solar cell including the transparent electrode according to one embodiment of the present invention may have various reflective structures according to the direction of light and thus may efficiently use the light, improving photoefficiency.

When a transparent electrode including a graphene sheet according to one embodiment of the present invention is applied to various devices, a thickness of the transparent electrode may be controlled considering transparency. For example, the transparent electrode may have a thickness ranging from 0.1 to 100 nm. When it has a thickness of more than 100 nm, the transparent electrode may have deteriorated transparency and thus poor photoefficiency. When it has a thickness of less than 0.1 nm, the transparent electrode may have excessively low sheet resistance and non-uniformity on the surface of the graphene sheet.

The solar cell including a transparent electrode including a graphene sheet according to one embodiment of the present invention may include a dye-sensitized solar cell. The dye-sensitized solar cell may include a semiconductor electrode, an electrolyte layer, and an opposed electrode. The semiconductor electrode may include a conductive transparent substrate and a photoabsorption layer and may be prepared by coating a colloid solution of a nanoparticle oxide on a conductive glass substrate, heating it at a high temperature in an electric furnace, and causing a dye to be adsorbed therein.

The conductive transparent substrate may include a transparent electrode including a graphene sheet according to one embodiment of the present invention. The transparent electrode may be prepared by directly forming the graphene sheet on a transparent substrate. The transparent substrate may include a transparent polymer material or a glass substrate such as polyethylene terephthalate, a polycarbonate, a polyimide, a polyamide, polyethylene naphthalate, or a copolymer thereof. These may be applied to an opposed electrode in the same manner.

The dye-sensitized solar cell may have a bending structure, for example, a cylindrical structure. The opposed electrode and the like as well as the transparent electrode may be soft and flexible.

The nanoparticle oxide for the solar cell may be semiconductor particulates, and in particular, an n-type semiconductor with a conductive band that supplies an anode current as a carrier under photo-excitement. Examples of the nanoparticle oxide may include $TiO_2$, $SnO_2$, $ZnO_2$, $WO_3$, $Nb_2O_5$, $Al_2O_3$, MgO, $TiSrO_3$, and the like, and particularly, an anatase-type $TiO_2$. The metal oxide may not be limited thereto. In addition, these oxides may be used singularly or as a mixture of two or more. This semiconductor particulate may have a larger surface area on which a dye can absorb more light, and thus may have a particle diameter of 20 nm or less.

In addition, the dye may include any dye that is generally used in a solar cell or the photo-battery field, but is preferably a ruthenium complex. The ruthenium complex may include $RuL_2(SCN)_2$, $RuL_2(H_2O)_2$, $RuL_3$, $RuL_2$, and the like (L in the formula indicates 2,2'-bipyridyl-4,4'-dicarboxylate and the like). However, the dye has no particular limit if it has charge-separating and sensitizing functions, and may include a xanthene-based colorant such as rhodamin B, rose bengal, eosine, erythrosine, and the like, a cyanine-based colorant such as quinocyanine, cryptocyanine, and the like, a basic dye such as phenosafranine, cabri blue, thiosine, methylene blue, and the like, a porphyrin-based compound such as chlorophyl, zinc porphyrin, magnesium porphyrin, and the like, a complex compound such as other azo colorants, a phthalocyanine compound, ruthenium trisbipyridyl, and the like, an anthraquinone-based colorant, a polycyclic quinine-based colorant, and a mixture thereof other than a ruthenium complex.

A photoabsorption layer including the nanoparticle oxide and dye may have a thickness of 15 μm or less, and preferably, ranging from 1 to 15 μm. The reason is that the photoabsorption layer may structurally have large series resistance, thereby deteriorating transformation efficiency. When it has a thickness of 15 μm or less, the layer may maintain its function but has low series resistance and thus prevents deterioration of transformation efficiency.

The dye-sensitized solar cell may include an electrolyte layer such as a liquid electrolyte, an ionic liquid electrolyte, an ionic gel electrolyte, a polymer electrolyte, and a composite thereof. For example, the electrolyte layer may mainly include an electrolyte with the photoabsorption layer added thereto, or a photoabsorption layer dipped in an electrolyte.

The electrolyte may include, for example, an acetonitrile solution of iodine and the like, but is not limited thereto and may include any electrolyte if it has a hole-conducting function.

In addition, the dye-sensitized solar cell may further include a catalyst layer. The catalyst layer promotes oxidation and reduction of a dye-sensitized solar cell. It may include platinum, carbon, graphite, carbon nanotubes, carbon black, a p-type semiconductor, a composite thereof, and the like, and may be disposed between the electrolyte layer and its counter electrode. The catalyst layer has a fine structure to have a larger surface area. For example, platinum may be in a platinum black state, and carbon may be porous. The platinum black state may be formed by treating platinum in an anodic oxidation method, a chloroplatinic acid treatment, and the like. The porous carbon may be acquired by sintering a carbon particulate, baking an organic polymer, and the like.

Since a dye-sensitized solar cell includes a transparent electrode including a graphene sheet with excellent conductivity and flexibility, it may have excellent photo-efficiency and workability.

According to one embodiment of the present invention, the transparent electrode including a graphene sheet may be applied to a display such as an electronic paper display, an optoelectronic device (organic or inorganic), a liquid crystal display, and the like. The organic optoelectronic device may be an active light-emitting display emitting light when electrons and holes are combined on an organic layer if a current flows into a fluorescent or phosphorescent organic compound thin film. In general, an organic optoelectronic device includes an anode on a substrate and a hole transport layer (HTL) on the anode, and an emission layer, an electron transport layer (ETL), and a cathode sequentially formed on the hole transport layer (HTL). The organic optoelectronic device may further include an electron injection layer (EIL) and a hole injection layer (HIL) to facilitate injection of electrons and holes, and additionally a hole blocking layer, a buffer layer, and the like if needed. Since the anode may be a transparent and very conductive material, and a transparent electrode including a graphene sheet according to one embodiment of the present may be usefully applied thereto.

The hole transport layer (HTL) may include a common material, and in particular, polytriphenylamine, but is not limited thereto.

The electron transport layer (ETL) may include a common material, and preferably, polyoxadiazole, but is not limited thereto.

A light-emitting material for the emission layer may include a generally-used fluorescent or phosphorescent light-emitting material without limit, but may further include one selected from one or more of a polymer host, a mixed host of a polymer and a low molecular host, a low molecular host, and a non-light-emitting polymer matrix. Herein, the polymer host, the low molecular host, and the non-light emitting polymer matrix may include any material used to form an emission layer for an organic electric field light emitting element. Examples of the polymer host may include poly(vinylcarbazole), polyfluorene, poly(p-phenylene vinylene), polythiophene, and the like. Examples of the low molecular host may include CBP (4,4'-N,N'-dicarbazole-biphenyl), 4,4'-bis[9-(3,6-biphenylcarbazolyl)]-1-1,1'-biphenyl{4,4'-bis[9-(3,6-biphenylcarbazolyl)]-1-1,1'-phenyl}, 9,10-bis[(2',7'-t-butyl)-9',9'''-spirobifluorenyl anthracene], tetrafluorene, and the like. Examples of the non-light emitting polymer matrix may include polymethylmethacrylate, polystyrene, and the like, but are not limited thereto. The aforementioned emission layer may be formed in a vacuum deposition method, a sputtering method, a printing method, a coating method, an Inkjet method, and the like.

According to one embodiment of the present invention, an organic electric field light emitting element may be fabricated without a particular device or method according to a method of fabricating an organic electric field light emitting element using a common light emitting material.

In addition, graphene according to one embodiment of the present invention may be used as an active layer for an electronic device.

The active layer may be used for a solar cell. The solar cell may include at least one active layer between lower and upper electrode layers laminated on a substrate.

The substrate may be, for example, one of a polyethylene terephthalate substrate, a polyethylene naphthalate substrate, a polyethersulfone substrate, an aromatic polyester substrate, a polyimide substrate, a glass substrate, a quartz substrate, a silicon substrate, a metal substrate, and a gallium arsenide substrate.

The lower electrode layer may include, for example, a graphene sheet, indium tin oxide (ITO), or fluorine tin oxide (FTO).

The electronic device may be a transistor, a sensor, or an organic/inorganic semiconductor device.

A conventional transistor, sensor, and semiconductor device may include a group IV semiconductor heterojunction structure and group III-V and II-VI compound semiconductor heterojunction structures, and restrict electron motion in two dimensions by using their band gap engineering to accomplish high electron mobility ranging from about 100 to 1000 $cm^2/Vs$. However, since graphene has high electron mobility ranging from 10,000 to 100,000 $cm^2/Vs$ through theoretical calculation, the graphene may have superb physical and electrical characteristics compared with a present electronic device when used as an active layer for a conventional transistor or organic/inorganic semiconductor device. In addition, the sensor may have a superb sensing characteristic compared with a conventional sensor, since it can sense a fine change according to adsorption/desorption of a molecule in one graphene layer.

A graphene sheet according to one embodiment of the present invention may be used for a battery.

The battery may include a lithium rechargeable battery.

A lithium rechargeable battery may be classified into a lithium ion battery, a lithium ion polymer battery, and a lithium polymer battery depending on a separator and an electrolyte, into a cylinder type, a prismatic type, a coin type, a pouch type, and the like in terms of a shape, and into a bulk type and a thin film type in terms of size. The structure and manufacturing method of these batteries are well-known and are not described in further detail.

The lithium rechargeable battery may include a cathode, an anode, a separator disposed between the cathode and the anode, and an electrolyte impregnating the cathode, the anode, and the separator, as well as a battery container and a sealing member sealing the battery container. The lithium rechargeable battery is fabricated by sequentially accumulating a cathode, an anode, and a separator, spirally winding them, and housing them in a battery container.

The anode and cathode may include a current collector, an active material, a binder, and the like. As for the current collector, the aforementioned graphene sheet according to one embodiment of the present invention may be used.

An electrode (anode or cathode) including the graphene sheet according to one embodiment of the present invention has excellent electron mobility, and thus improves the rate characteristic, life-span characteristic, and the like of a battery. However, the graphene sheet according to one embodiment of the present invention is not limited to the aforementioned usage, but may be used in any field and usage using the characteristics of the graphene sheet.

Hereinafter, the embodiments are illustrated in more detail with reference to examples. However, the following are exemplary embodiments and are not limiting.

EXAMPLE

Preparation of Graphene

Example 1

Formation of Graphene on $SiO_2$/Si Substrate

A liquid carbon source material was used to form graphene on a $SiO_2$/Si substrate according to the present exemplary embodiment. The $SiO_2$ layer was 300 nm thick, and was formed by depositing $SiO_2$ on a Si substrate.

The $SiO_2$/Si substrate was cleaned on the surface, and then a 100 nm-thick nickel thin film was deposited on the substrate by using an electron beam evaporator. During the deposition, the substrate was maintained at 400° C.

Figure 3:
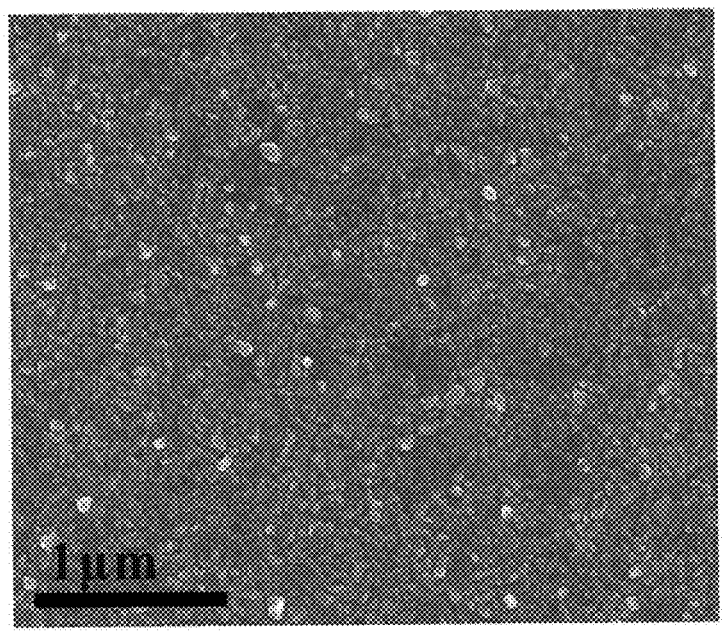
FIG. 3 is the SEM photograph of a nickel thin film deposited according to Example 1.

FIG. 3 shows a SEM photograph of the nickel thin film deposited in Example 1.

The SEM photograph shows that a polycrystalline nickel thin film was formed with a grain size ranging from about 50 to 150 nm (an average size of 100 nm).

The nickel thin film was heat-treated to improve the grain orientation and to increase the average grain size. The heat treatment was performed in a high-vacuum chamber, in which highly pure hydrogen was used to have a hydrogen atmosphere. When the nickel thin film was heat-treated at 1000° C. under an appropriate hydrogen atmosphere, grains with a size of about 10 μm were mostly oriented in a 111 direction.

Figure 4:
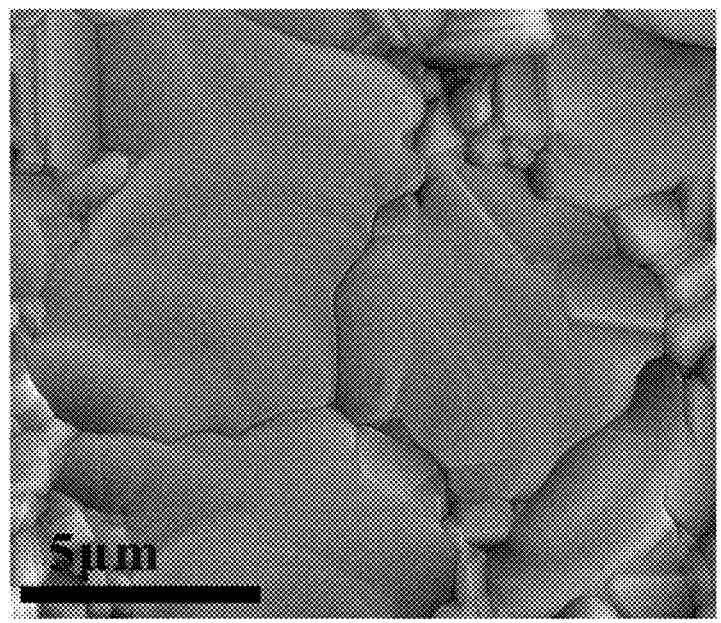
FIG. 4 is the SEM photograph of the nickel thin film after the heat treatment according to Example 1.

FIG. 4 shows a SEM photograph of the heat-treated nickel thin film with a grain size ranging from about 1 to 20 μm according to Example 1.

Then, graphite powder was used as a carbon source material. The graphite powder was made by Sigma-Aldrich Co. (Product No. 496596, Batch No. MKBB1941) and had an average particle size of 40 μm or less. The graphite powder was mixed with ethanol into a slush. The slush was plastered on the substrate deposited with the nickel thin film and dried at an appropriate temperature, and was then fixed with a molybdenum-made holding stage.

This specimen was heat-treated in a tube furnace so that the carbon source material could be decomposed and spontaneously diffused into the nickel thin film.

The heat treatment was performed at 465° C. The temperature was increased within 10 minutes under an argon atmosphere. The temperature was maintained for 5 minutes.

After the diffusion through the heat treatment, the nickel thin film was etched to reveal the graphene formed on the interface between nickel thin film and $SiO_2$. A $FeCl_3$ aqueous solution was used for the etching. The etching was performed by using a 1M $FeCl_3$ aqueous solution for 30 minutes. As a result, graphene with high quality and a large area was formed on the $SiO_2$/Si substrate.

Figure 5:
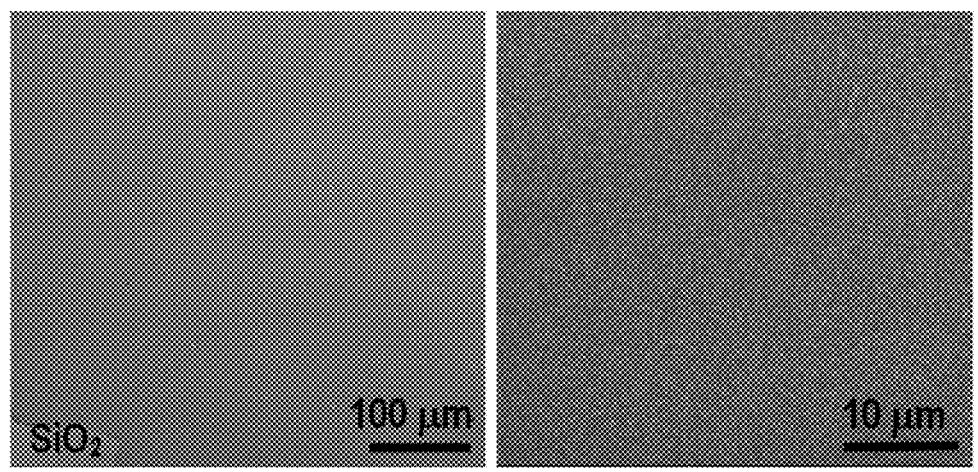
FIG. 5 is the SEM photograph of the graphene sheet according to Example 1.
Figure 6:
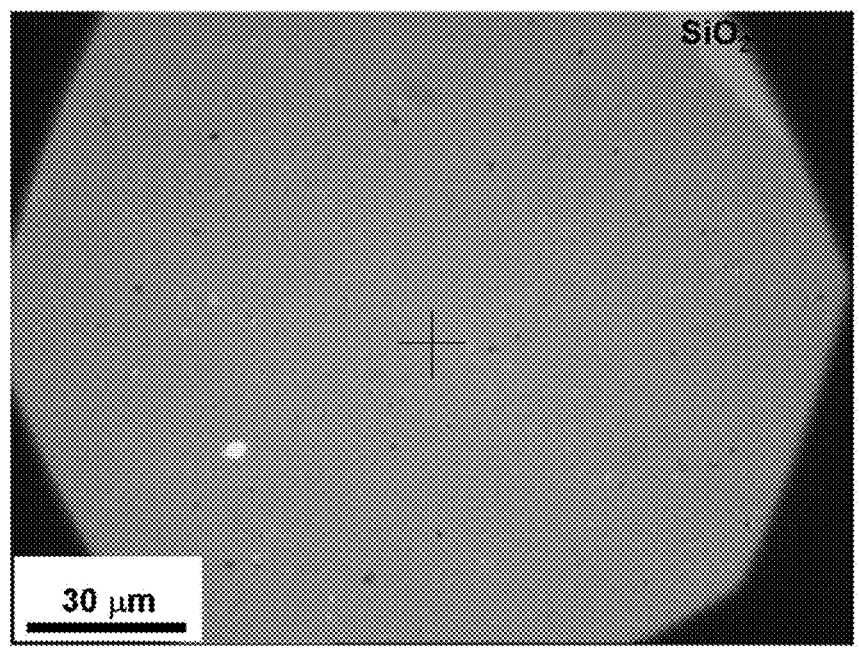
FIG. 6 is the optical microscope photograph of the graphene sheet according to Example 1.

FIG. 5 shows a SEM photograph of the graphene sheet, and FIG. 6 shows an optical microscope photograph of the graphene sheet. Referring to the SEM photographs, it can be seen that the graphene sheet was uniformly formed.

In addition, as shown in the FIGS. 5 and 6, the graphene according to Example 1 was directly formed on the SiO$_2$/Si substrate at a low temperature and thus had no wrinkle, which might be generated due to different thermal expansion coefficients of the graphene and the lower substrate in case of CVD process.

In other words, the lower sheet was flat and uniform. In general, a wrinkle on a graphene sheet is known as one of the main reasons of deteriorated properties of the graphene sheet.

Example 2

A graphene sheet was formed according to the same method as Example 1 except for injecting a carbon source material into a nickel thin film at 160° C. and heat-treating the mixture.

Figure 7:
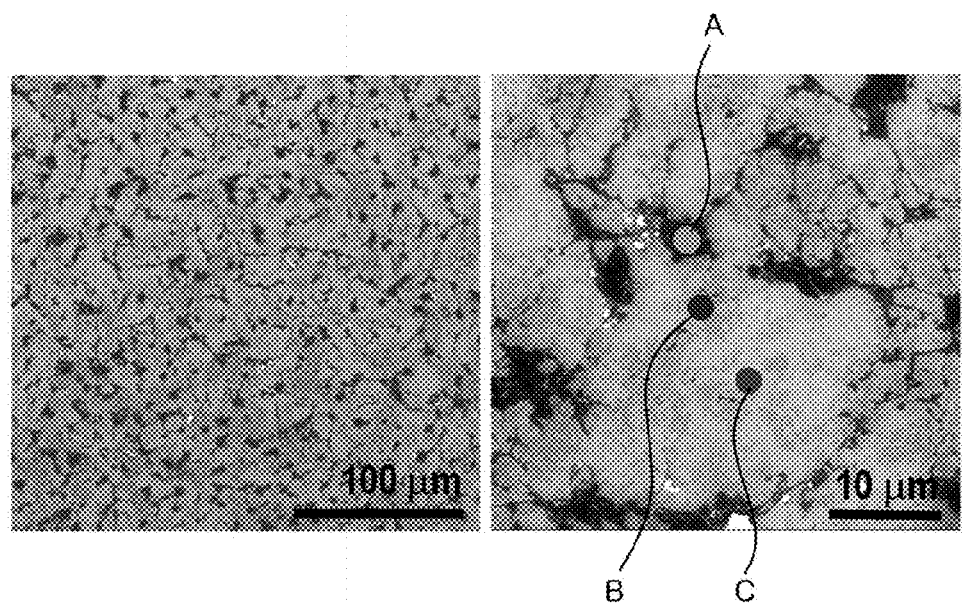
FIG. 7 is the SEM photograph of a graphene sheet according to Example 2.
Figure 8:
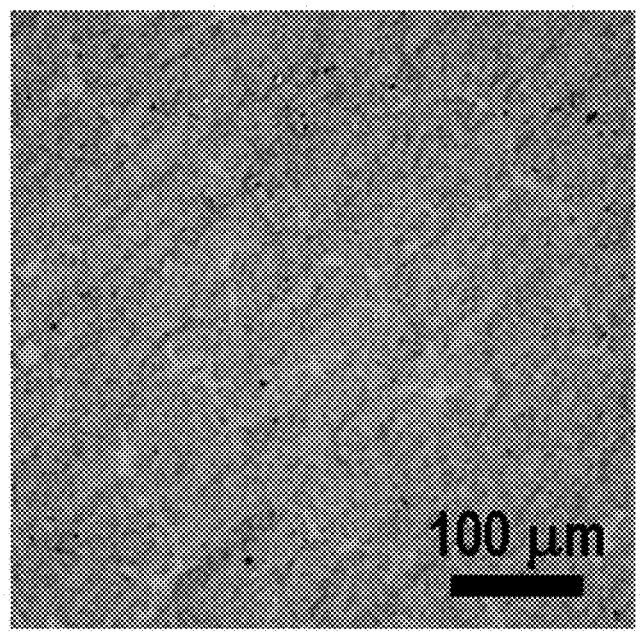
FIG. 8 is the optical microscope photograph of the graphene sheet according to Example 2.

FIG. 7 shows SEM photographs of the graphene sheet according to Example 2, and FIG. 8 shows an optical microscope photograph of the graphene sheet according to Example 2.

As shown in FIG. 7, the graphene of Example 2 had a large grain size ranging from several microns to tens of microns. The SEM photographs show a clear image luminosity contrast depending on thickness of the graphene. The lightest part is one graphene layer (C), the light part is two graphene layers (B), and the dark part is multiple graphene layers (A). The multi-graphene layers indicate ridges.

As shown in FIG. 7, the ridges have a continuous or discontinuous metal grain boundary shape. Accordingly, the ridges may have various gaps depending on the cross-sections. However, the maximum gap among the ridges is approximately equal to the maximum diameter of the metal grain boundary.

The graphene according to Example 2 had a maximum gap among ridges in a range of 1 μm to 50 μm. The ridges were formed of at least three graphene layers, had various heights depending on temperature, time, and position for graphene growth, and tended to be thinner from the center to the edge.

The graphene of Example 2 had a 15 to 30 layer ridge in the center.

In addition, as shown in FIGS. 7 and 8, the graphene sheet of Example 2 was directly formed on the SiO$_2$/Si substrate at a low temperature and had no wrinkles, which might be generated due to different thermal expansion coefficients of the graphene sheet and a lower substrate in case of CVD process. In general, the wrinkle of graphene is one of the main causes of deteriorated properties of the graphene.

Example 3

Graphene was prepared according to the same method as Example 1 except for injecting a carbon source material into a nickel thin film and heat-treating the nickel thin film at 60° C. for 10 minutes.

Example a

Graphene was prepared according to the same method as Example 1 except for injecting a carbon source material into a nickel thin film and heat-treating the nickel thin film at room temperature for 30 minutes.

Example 4

Formation of Graphene Sheet on Poly[methylmethacrylate] (Hereinafter Referred to be "PMMA")

PMMA as an initial powder was mixed with chlorobenzene as a solvent in a ratio (15 wt %) of PMMA:chlorobenzene=1: 0.2. The mixture was deposited on a silicon substrate in a sol-gel process.

In other words, the mixture was spin-coated on an about 1 cm$^2$-thick silicon substrate at a speed of 3000 RPM for 45 seconds, and impurities and moisture remaining therein were removed at 70° C. for 15 minutes.

Figure 11:
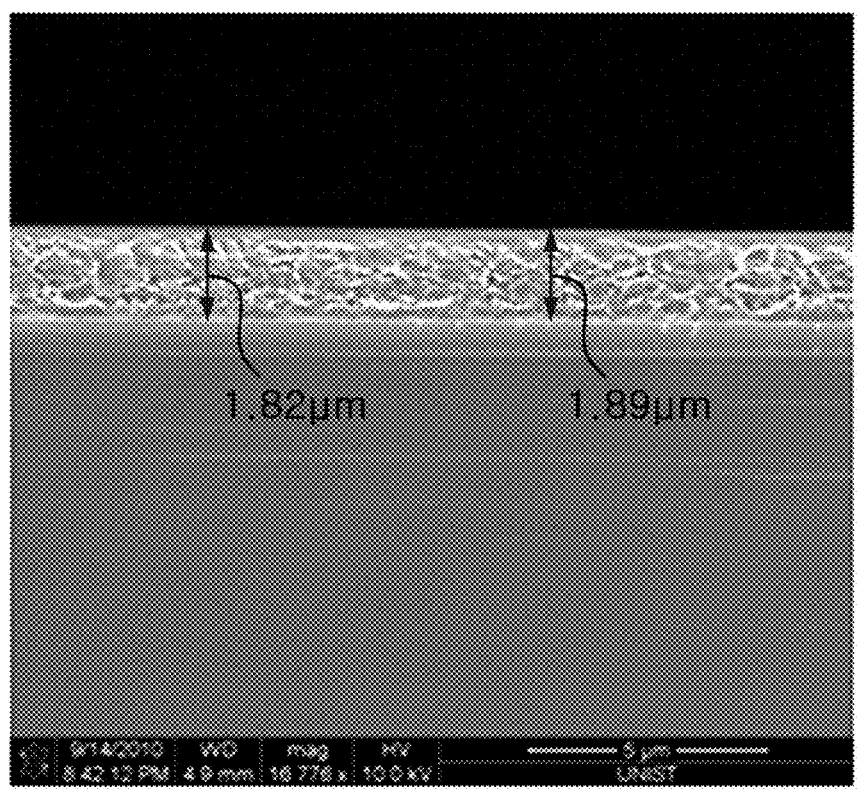
FIG. 11 is the SEM photograph of the cross section of a PMMA layer on a silicon substrate according to Example 4.

FIG. 11 provides a SEM photograph showing the cross-section of the PMMA layer on a silicon substrate.

Then, a 100 nm-thick nickel thin film was deposited on the PMMA layer by using an electron beam evaporator. Since an organic material such as PMMA and the like has a low melting point of 200° C. or less, a substrate was maintained at room temperature during the nickel deposition.

The nickel thin film deposited at room temperature on the PMMA layer was checked through XRD. As a result, a polycrystalline thin film was identified to have a ratio of about 8:1 between the grains with 111 and 200 orientations. The grain had an average size ranging from about 40 to 50 nm. Since the PMMA is weak against heat, it was not heat-treated after growth of the nickel thin film.

Then, the graphite slush was plastered on the nickel/PMMA according to the same method as Example 1 and was fixed with a molybdeum-made holding stage, preparing a specimen. The specimen was heat-treated in a tube furnace, so that the carbon source material could be decomposed and spontaneously diffused through the nickel thin film.

The heat treatment was performed at 60° C. under an argon atmosphere. The temperature was increased within 5 minutes. The temperature was maintained for 10 minutes.

After diffusion of the carbon source material through the heat treatment, the nickel thin film was etched to reveal graphene on the interface with the PMMA. The etching was performed by using a FeCl$_3$ aqueous solution. In particular, a 1M FeCl$_3$ aqueous solution was used. The etching was performed for 30 minutes. As a result, graphene was formed all over the PMMA.

Figure 12:
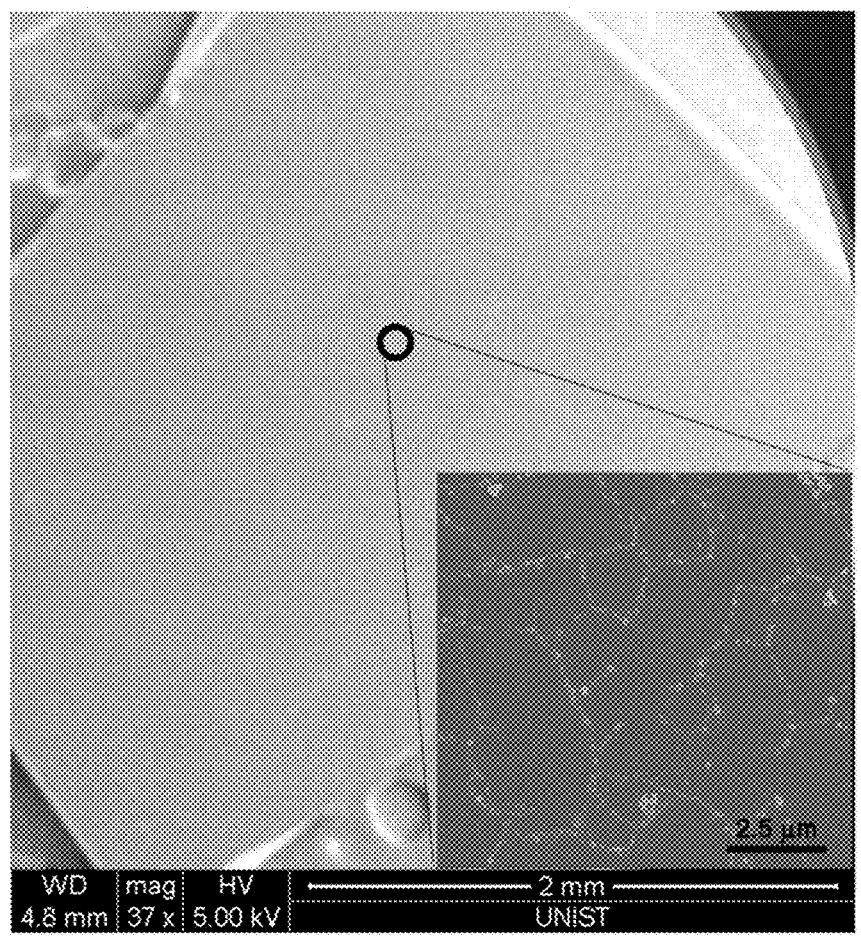
FIG. 12 is the SEM photograph of a graphene sheet according to Example 4.

FIG. 12 shows a SEM photograph of the graphene sheet according to Example 4. The graphene sheet was formed to be uniform as seen in the SEM photograph.

FIG. 12 also shows a ridge with a metal grain shape. As aforementioned, since the ridge had a continuous or discontinuous metal grain boundary, a gap among the ridges might be changed depending on the cross-section of the graphene. However, the ridges might be approximately equal to the maximum diameter of the metal grain boundary.

The graphene according to Example 4 had a maximum gap among the ridges within a range of 30 nm to 100 nm. The ridge was formed of at least three graphene layers and had various heights depending on temperature, time, and location of graphene growth but became thinner from the center to the edge.

The graphene of Example 4 had 10 to 30 layers in the center of the ridge.

Example 5

Graphene was prepared according to the same method as Example 4 except for injecting a carbon source material into a nickel thin film and heat-treating the nickel thin film at 40° C.

Example 6

Graphene was prepared according to the same method as Example 4 except for injecting a carbon source material into a nickel thin film and heat-treating the nickel thin film at 150° C.

Example 7

Graphene was prepared according to the same method as Example 4 except for injecting a carbon source material into a nickel thin film and heat-treating the nickel thin film at 150° C. for 30 minutes.

Example 8

Graphene Formation on Polydimethylsiloxane (Hereinafter Referred to be "PDMS")

Graphene was prepared according to the same method as Example 4 except for using PDMS instead of PMMA. However, a PDMS thin film was formed as follows.

PDMS with a highly dense molecular weight of 162.38 has strong durability and thus was mixed with a hardener (PDMS kit B) and cured without a sol-gel process regardless of its thickness.

PDMS (A) and a hardener (PDMS kit B) were mixed in a ratio of 10:1 or 7:3 at most, and crosslinked together. The two materials with high viscosity in a gel status were mixed, post-processed, and cured. Since PDMS has flexibility, it was bonded on a silicon substrate for the following process.

The following process is the same as in Example 4 and will not be repetitively illustrated.

Example b

Graphene Formation on Glass Substrate

Graphene was prepared according to the same method as Example 4 except for using a glass substrate instead of PMMA.

Example c

Graphene Formation on $SiO_2$/Si Substrate

A liquid carbon source material was used to form graphene on a $SiO_2$/Si substrate. The $SiO_2$ layer was 300 nm thick and deposited on a Si substrate in a thermal growth method.

The $SiO_2$/Si substrate was cleaned on the surface, and a 100 nm-thick nickel thin film was deposited thereon using an electron beam evaporator. During the deposition, the substrate was maintained at 400° C.

Hereinafter, graphite powder was used as a carbon source material. The graphite powder was manufactured by Sigma-Aldrich Co. (product 496596, batch No. MKBB1941) and had an average particle size of 40 μm or less. The graphite powder was mixed with ethanol into a slush. The slush was plastered on the substrate on which a nickel thin film was deposited, dried at an appropriate temperature, and fixed with a molybdeum-made holding stage.

The above specimen was heat-treated in a tube furnace, so that the carbon source material could be decomposed and spontaneously diffused into the nickel thin film.

The heat treatment was performed at 160° C. The temperature was increased within 10 minutes under an argon atmosphere. The temperature was maintained for 5 minutes.

After the diffusion through the heat treatment, the nickel thin film was etched to reveal the graphene formed on the interface between the nickel thin film and the $SiO_2$. The etching was performed by using an $FeCl_3$ aqueous solution. The etching was performed for 30 minutes by using the 1M $FeCl_3$ aqueous solution. As a result, graphene with high quality and a large area was formed on the $SiO_2$/Si substrate.

Figure 16:
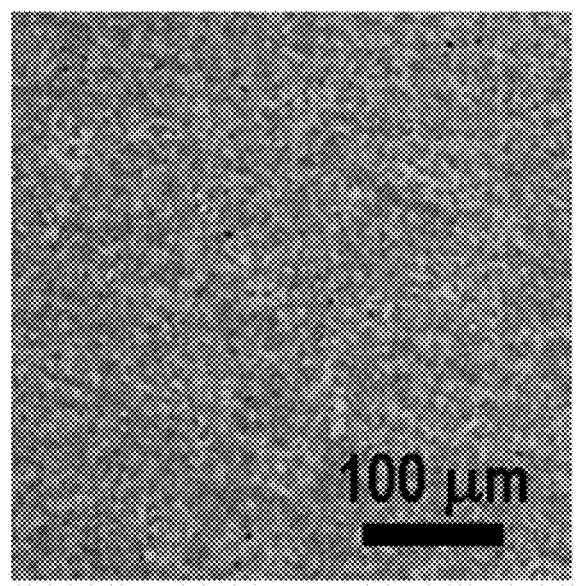
FIG. 16 is the optical microscope photograph of a graphene sheet according to Example c.

FIG. 16 provides an optical microscope photograph of the graphene sheet according to Example c. The graphene sheet was identified to be uniform.

Figure 17:
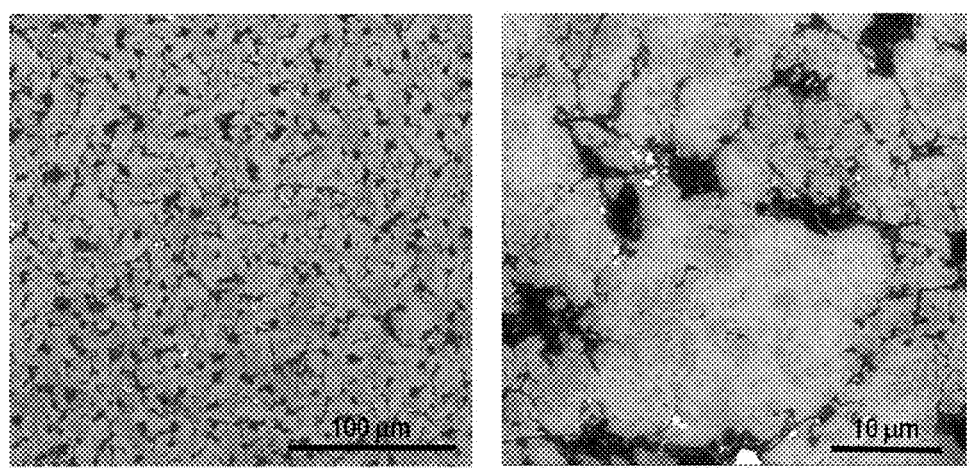
FIG. 17 is the SEM photograph of the graphene sheet according to Example c.

FIG. 17 provides an SEM photograph of the graphene sheet according to Example c.

As shown in FIGS. 6 and 17, the graphene of Example c was formed at a low temperature and thus had no wrinkle, which might be generated due to different thermal expansion coefficients of the graphene and a lower substrate.

In other words, the lower sheet was even on the surface. In general, a wrinkle on a graphene sheet is known to be a main cause of deterioration of properties of the graphene sheet.

Comparative Example c1

Graphene According to Nature 457, 706 (2009)

Graphene was prepared according to a method illustrated in Nature 457, 706 (2009). Schematically illustrated, graphene was formed on nickel in a chemical vapor deposition (CVD) method and transferred to a $SiO_2$ substrate.

Figure 19:
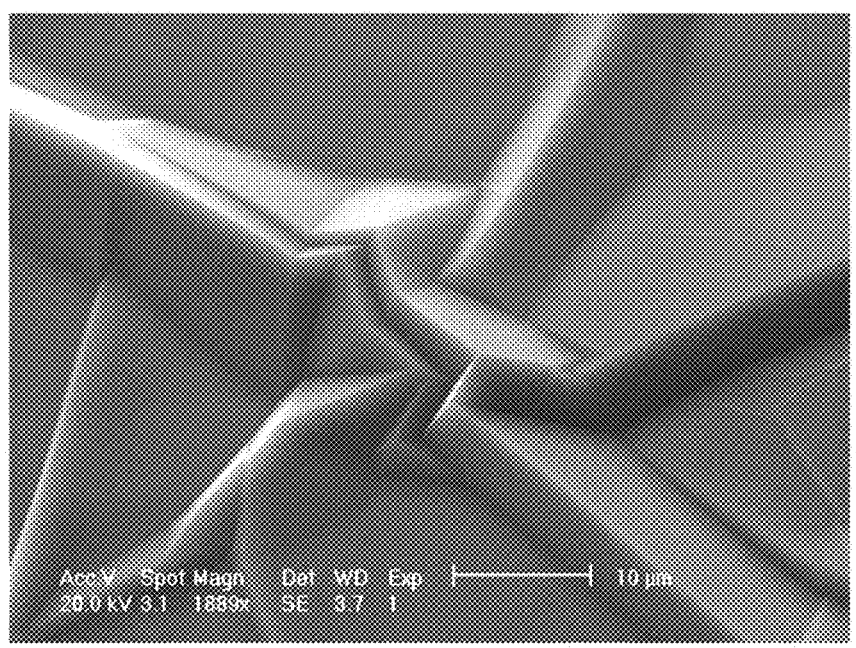
FIG. 19 is the SEM photograph of the surface of the graphene according to Comparative Example c1.
Figure 20:
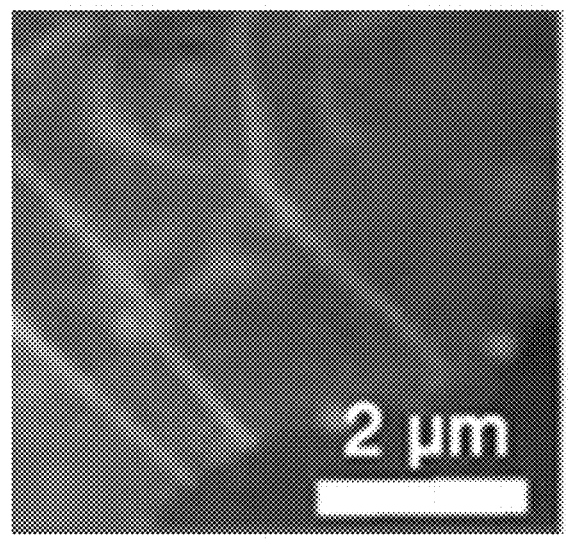
FIG. 20 shows the AFM photograph of the surface of the graphene according to Comparative Example c1.

FIG. 19 provides a SEM photograph of the surface of the graphene according to Comparative Example c1, and FIG. 20 provides an AFM photograph of the surface of the graphene according to Comparative Example c1.

Referring to FIGS. 19 and 20, the graphene was found to have many wrinkles.

Comparative Example c2

Graphene According to Science 324, 1312 (2009)

Graphene was prepared according to a method provided in Science 324, 1312 (2009). Schematically illustrated, graphene was formed on copper in a chemical vapor deposition (CVD) method and transferred to a $SiO_2$ substrate.

EXPERIMENTAL EXAMPLE

Graphene Characteristic Evaluation

Electrical Characteristic Evaluation

Figure 9:
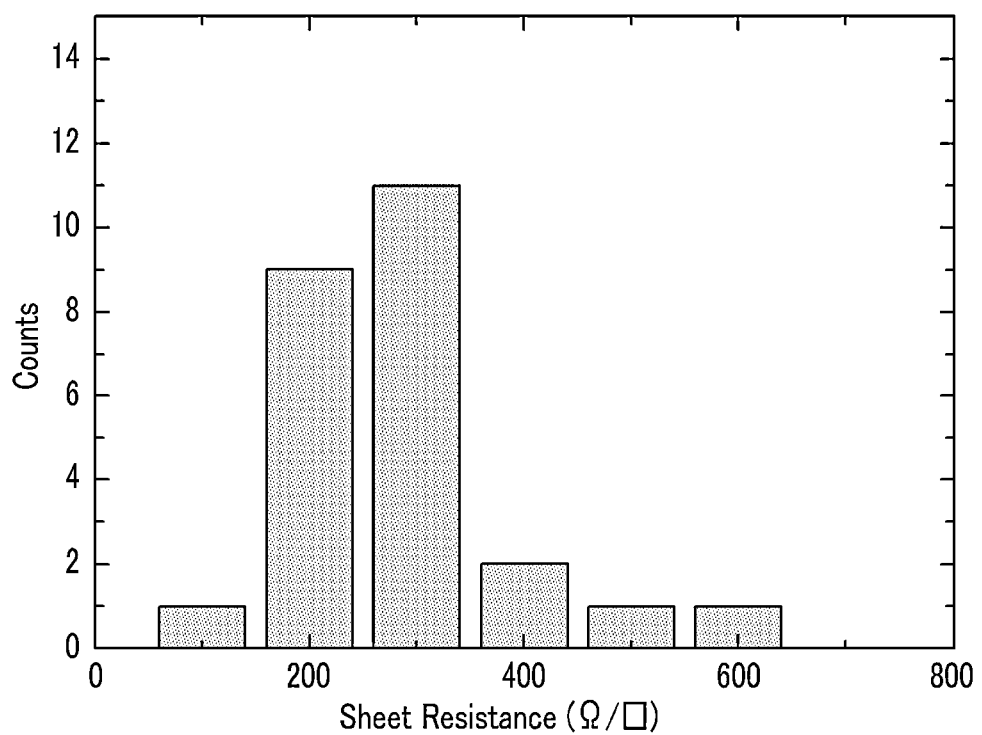
FIG. 9 provides sheet resistance measurement results of a graphene sheet according to Example 3.

The graphene of Example 3 was patterned to be 100 μm×100 μm and measured in a Van der Pauw method. As a result, the graphene had resistance of about 274 Ω/square. The result is provided in FIG. 9.

This result is remarkably small compared with that of graphene formed at a high temperature in a CVD method (equal to or under approximately 1000Ω/□). Accordingly, the graphene of Example 3 had excellent electric characteristics.

In other words, graphene according to one embodiment of the present invention grew to have a large area at 300° C. or lower, in particular, at 40° C. or near room temperature, and directly grew not on a metal substrate but on an inorganic or organic substrate without transferring and thus had better characteristics than graphene grown in a CVD method.

Optical Properties Evaluation

Figure 14:
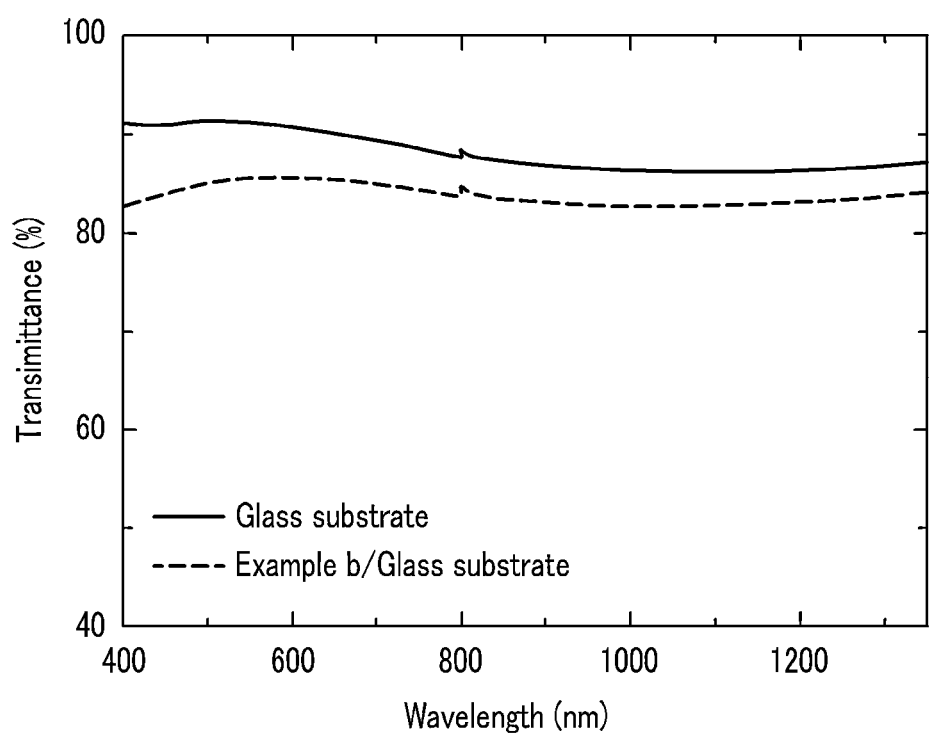
FIG. 14 provides light transmission degree measurements of a graphene sheet according to Example b.

The graphene according to Example b was evaluated regarding transparency in a visible light region in a UV-VIS method. As shown in FIG. 14, the graphene grown on a glass substrate had high transparency of 80% or more in all the visible light regions and about 2 to 7% less transparency than that of the glass substrate itself.

On the other hand, one-layered graphene is known to lower transparency by 2.3%. Thus, the graphene is indirectly identified to have three layers.

Therefore, the graphene of Example b had remarkably higher transparency than graphene prepared in a chemical vapor deposition (CVD) method, and thus was identified to have excellent optical properties.

Heat treatment Condition Evaluation to Increase Grains of Metal Thin Film

Graphene may have a larger grain size by heat-treating a metal thin film to adjust its grain orientation and to increase grain size, and thus has improved characteristics.

Herein, the heat treatment should not damage a subject substrate. Accordingly, the Ni/SiO$_2$/Si of Example 1 was heat-treated at 1000° C. in a high vacuum ($10^{-9}$ Torr) chamber, obtaining a nickel thin film with an average grain size of about 5 µm and a 111 orientation.

Figure 10:
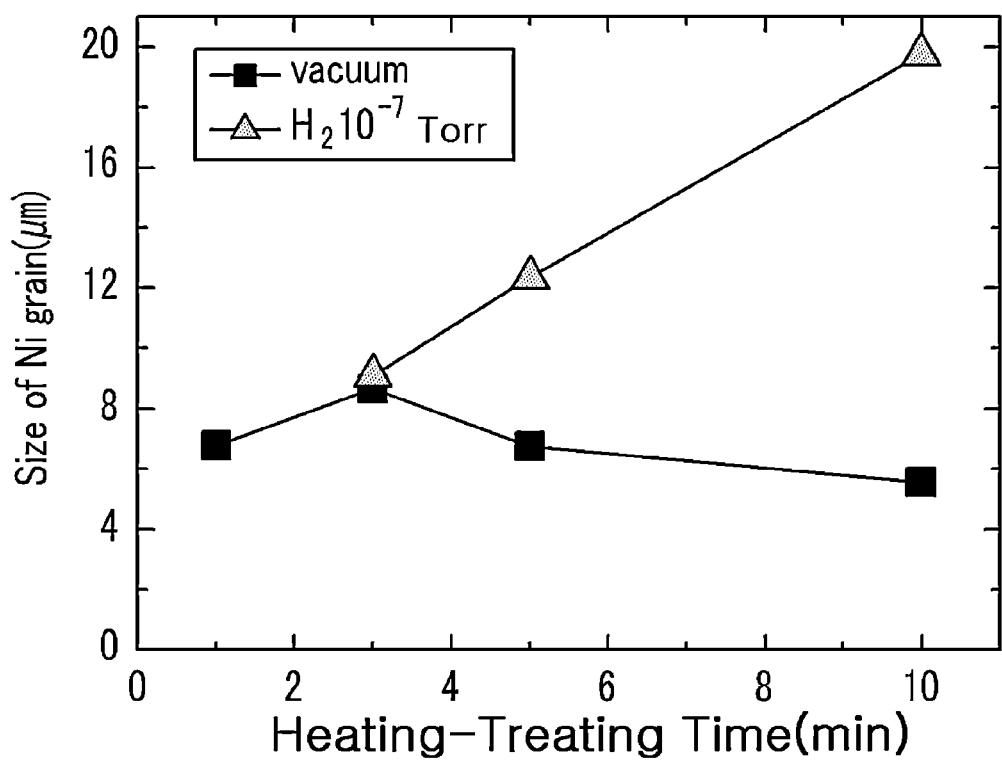
FIG. 10 provides a graph showing the average grain size change of a nickel thin film depending on heat treatment time under a vacuum and hydrogen atmosphere.

FIG. 10 provides a graph showing the average grain size change of the nickel thin film according to heat treatment time under a hydrogen atmosphere.

When a nickel thin film is heat-treated by flowing hydrogen, nickel grains may grow to have a several times larger size. Herein, when the heat treatment was performed for 10 minutes by flowing hydrogen at $10^{-7}$ Torr, a nickel thin film might have a grain with an average size of 20 µm or so and a 111 orientation.

However, when hydrogen is applied at more than an appropriate amount during the heat treatment, a nickel thin film may have a larger grain size, but a carbon source material reacts with hydrogen during its diffusion into the nickel thin film and does not grow graphene on SiO$_2$/Si.

Graphene Thickness Measurement using Atomic Force Microscope (AFM)

Since the graphene of Example 4 grew to have a large area on an organic material substrate and thus was hard to measure, it was transferred onto a SiO$_2$/Si substrate.

Then, the graphene was measured regarding thickness using an atomic microscope.

Figure 13:
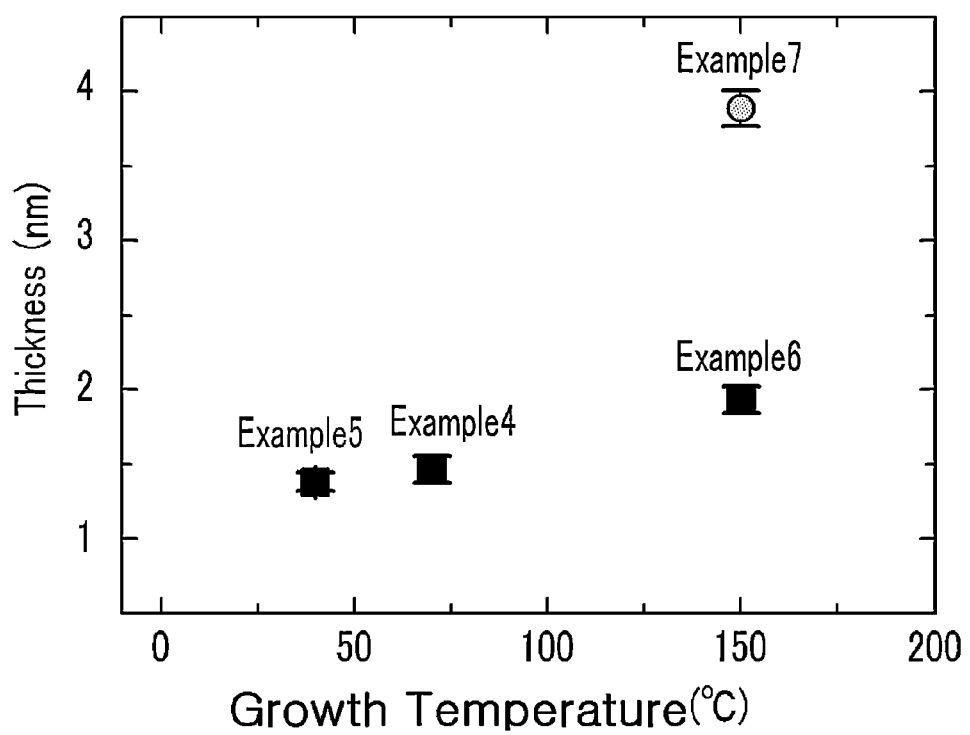
FIG. 13 provides thickness measurements of the graphenes according to Examples 4 to 7.

FIG. 13 provides thicknesses of the graphenes according to Examples 4 to 7. The graphenes had a thickness ranging from about 1 to 2 nm and mostly from one to three layers.

Raman-Mapping Data Analysis

Figure 18:
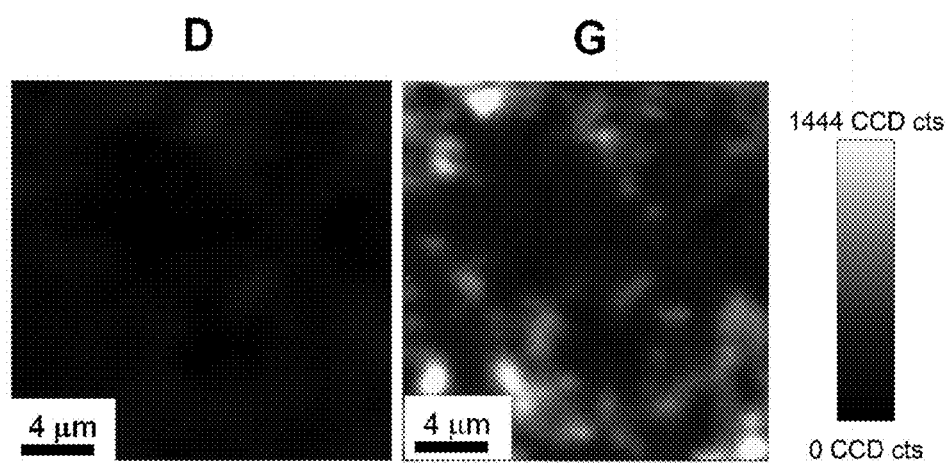
FIG. 18 provides Raman mapping data of the graphene according to Example c.
Figure 21:
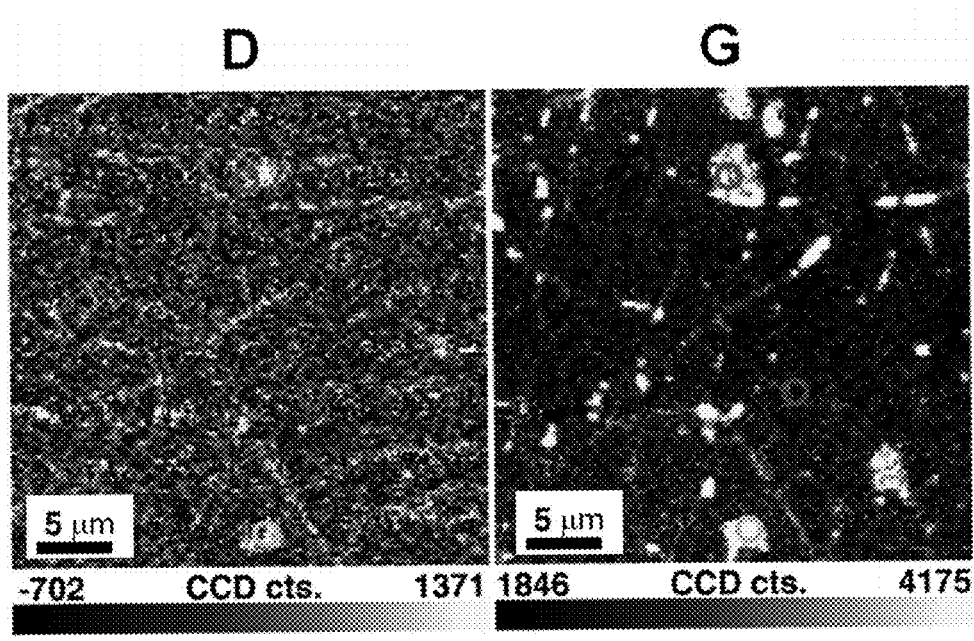
FIG. 21 provides Raman mapping data of graphene according to Comparative Example c2.

FIG. 18 provides Raman-mapping data of the graphene of Example c, and FIG. 21 provides Raman-mapping data of the graphene of Comparative Example c2.

The Raman-mapping analysis was performed using WiTec alpha 300R M-Raman equipment.

Herein, a laser with a wavelength of 532 nm and a diameter of 500 nm as a light source and a charge-coupled device (CCD) camera were used. A G peak had a mapping range of 1540 cm$^{-1}$ to 1640 cm$^{-1}$, and a D peak of 1300 cm$^{-1}$ to 1400 cm$^{-1}$.

In general, a D peak is regarded as a defect in the Raman measurement of graphene, while a G peak is regarded as graphene itself.

In the D and G peak mapping of FIG. 18, the graphene of Example c had no line due to wrinkles, unlike the graphene of Comparative Example c2 in FIG. 21.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting in any way.

| <Description of Symbols> | | |
|---|---|---|
| 100: graphene sheet | 101: lower sheet | 102: ridge |

What is claimed is:

1. A graphene sheet comprising:
   a graphene lower sheet including 1 to 20 graphene layers accumulated on a substrate, and
   a ridge formed on the graphene lower sheet,
   wherein the ridge has a metal grain boundary shape and comprises more graphene layers than the graphene lower sheet, and
   wherein the lowest graphene layer contacting the substrate in the graphene sheet is continually formed without any wrinkles.

2. The graphene sheet of claim 1, wherein all the graphene layers in the graphene sheet are continually formed without any wrinkles.

3. The graphene sheet of claim 1, wherein the graphene sheet has an area of equal to or more than 1 µm$^2$.

4. The graphene sheet of claim 1, wherein the graphene sheet is directly formed on the substrate.

5. The graphene sheet of claim 1, wherein the ridge comprises 3 to 50 graphene layers.

6. The graphene sheet of claim 1, wherein the metal has a grain size ranging from 10 nm to 10 mm.

7. The graphene sheet of claim 1, wherein the metal has a grain size ranging from 10 nm to 500 µm.

8. The graphene sheet of claim 1, wherein the metal has a grain size ranging from 50 nm to 10 µm.

9. The graphene sheet of claim 1, which has a light transmission degree of equal to or more than 60%.

10. The graphene sheet of claim 1, which has transparency of equal to or more than 80%.

11. The graphene sheet of claim 1, which has sheet resistance of equal to or less than 2000 Ω/square.

12. The graphene sheet of claim 1, which has sheet resistance of equal to or less than 274 Ω/square.

13. A transparent electrode comprising the graphene sheet according to claim 1.

14. An active layer including the graphene sheet according to claim 1.

15. A display device comprising the transparent electrode of claim 13.

16. An electronic device comprising the active layer of claim 14.

17. The display device of claim 15, wherein the display device is a liquid crystal display, an electronic paper display device, or an optoelectronic device.

18. The electronic device of claim 16, wherein the electronic device is a transistor, a sensor, or an organic/inorganic semiconductor device.

19. An optoelectronic device comprising
   an anode, a hole transport layer (HTL), an emission layer, an electron transport layer (ETL), and a cathode,
   wherein the anode is the transparent electrode according to claim 13.

* * * * *